(12) United States Patent
Hegblom

(10) Patent No.: US 11,398,716 B2
(45) Date of Patent: *Jul. 26, 2022

(54) VERTICAL-CAVITY SURFACE-EMITTING LASER ARRAY WITH MULTIPLE METAL LAYERS FOR ADDRESSING DIFFERENT GROUPS OF EMITTERS

(71) Applicant: Lumentum Operations LLC, San Jose, CA (US)

(72) Inventor: Eric R. Hegblom, Milpitas, CA (US)

(73) Assignee: Lumentum Operations LLC, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/949,520

(22) Filed: Nov. 2, 2020

(65) Prior Publication Data
US 2021/0075196 A1 Mar. 11, 2021

Related U.S. Application Data

(62) Division of application No. 16/132,009, filed on Sep. 14, 2018, now Pat. No. 10,826,278.
(Continued)

(51) Int. Cl.
*H01S 5/42* (2006.01)
*H01S 5/028* (2006.01)
(Continued)

(52) U.S. Cl.
CPC .............. *H01S 5/423* (2013.01); *H01S 5/028* (2013.01); *H01S 5/02345* (2021.01);
(Continued)

(58) Field of Classification Search
CPC ...... H01S 5/423; H01S 5/02345; H01S 5/028; H01S 5/04256; H01S 5/18308;
(Continued)

(56) References Cited

U.S. PATENT DOCUMENTS

| 10,826,278 B2 * | 11/2020 | Hegblom ................ H01S 5/423 |
| 2017/0070027 A1 | 3/2017 | Kondo et al. |
| 2018/0269655 A1 | 9/2018 | Koyama et al. |

FOREIGN PATENT DOCUMENTS

| CN | 1881606 A | 12/2006 |
| CN | 102714396 A | 10/2012 |

(Continued)

*Primary Examiner* — Xinning(Tom) Niu
(74) *Attorney, Agent, or Firm* — Harrity & Harrity, LLP

(57) ABSTRACT

An optical device may include an array of vertical-cavity surface-emitting lasers (VCSELs) having a design wavelength, each VCSEL having an emission area. The optical device may include a first metal layer, substantially covering the array, a second metal layer substantially covering the first metal layer, and an electrical isolation layer, between the first metal layer and the second metal layer, that includes vias for electrically connecting portions of the first metal layer and portions of the second metal layer. The optical device may include a dielectric disposed over the emission area of each VCSEL. A variation in a thickness of the dielectric across at least approximately 90% of an area of the dielectric may be less than approximately 2% of the design wavelength. A depth of a well around the emission area may be equal to at least approximately 10% of a width of the emission area.

20 Claims, 21 Drawing Sheets

Related U.S. Application Data

(60) Provisional application No. 62/571,113, filed on Oct. 11, 2017.

(51) Int. Cl.
*H01S 5/183* (2006.01)
*H01S 5/042* (2006.01)
*H01S 5/02345* (2021.01)
*G01S 7/481* (2006.01)
*H01S 5/187* (2006.01)

(52) U.S. Cl.
CPC ...... *H01S 5/04256* (2019.08); *H01S 5/18308* (2013.01); *H01S 5/18313* (2013.01); *G01S 7/4815* (2013.01); *H01S 5/0282* (2013.01); *H01S 5/187* (2013.01); *H01S 5/18305* (2013.01); *H01S 5/18369* (2013.01); *H01S 2301/176* (2013.01); *H01S 2304/02* (2013.01); *H01S 2304/04* (2013.01)

(58) Field of Classification Search
CPC ............... H01S 5/18313; H01S 5/0282; H01S 5/18305; H01S 5/18369; H01S 5/187; H01S 2301/176; H01S 2304/02; H01S 2304/04; H01S 5/02469; H01S 5/183; G01S 7/4815; H01L 21/76832; H01L 21/76846; H01L 27/0229; H01L 27/102
See application file for complete search history.

(56) References Cited

FOREIGN PATENT DOCUMENTS

| CN | 102891434 A | 1/2013 |
| CN | 103843211 A | 6/2014 |

\* cited by examiner

VERTICAL-CAVITY SURFACE-EMITTING LASER ARRAY WITH MULTIPLE METAL LAYERS FOR ADDRESSING DIFFERENT GROUPS OF EMITTERS

RELATED APPLICATIONS

This application is a divisional of U.S. patent application Ser. No. 16/132,009, filed Sep. 14, 2018 (now U.S. Pat. No. 10,826,278), which claims priority under 35 U.S.C. § 119 to U.S. Provisional Patent Application No. 62/571,113, filed on Oct. 11, 2017, the contents of which are incorporated by reference herein in their entireties.

TECHNICAL FIELD

The present disclosure relates generally to a vertical-cavity surface-emitting laser (VCSEL) array and, more particularly, to a VCSEL array including multiple metal layers for addressing different groups of emitters.

BACKGROUND

Determining a depth in a real-world image can be used in a variety of applications, such as augmented reality, gesture recognition (e.g., for a gaming system), facial recognition (e.g., for a consumer device), scene analysis (e.g., for an automated driving system), and/or the like. Stereo vision is one technique for determining depth in a real-world image. Stereo vision relies on accurately correlating points observed from a pair of cameras (e.g., a left camera and a right camera). However, the stereo vision technique is not effective when there are not distinct features over large regions of the image that can be matched.

More recently, sensors for depth determination based upon semiconductor lasers have been developed. One technique that uses such a sensor is a time-of-flight technique. The time-of-flight technique relies on accurate sensing of a delay between a transmitted light pulse and a received light pulse to measure distance. Typically, the delay is detected based on a time difference between the time of the transmitted light pulse and the time of the received light pulse (i.e., a time-delay between the transmitted and received light pulses), and a distance to an object can be determined based on the delay (e.g., since the speed of light is known). An image can be generated based on determining distances to various locations in a field of view.

Another technique that uses such a sensor is a structured light technique. The structured light technique utilizes a pattern of spots displayed across a field of view. Here, spot sizes and spot separation (e.g., distances between spots) depend on a distance to objects in the field of view. For example, spot sizes and spot separation are comparatively larger for objects that are further from a light source, and are comparatively smaller for objects that are closer to the light source. According the structured light technique, an image (e.g., a 3D image) is determined based on these spot sizes and separations across the field of view. The spots are typically emitted by a laser in conjunction with diffractive optics, and are in a non-uniform pattern (e.g., a random pattern) in order to allow the non-uniform pattern to be located in the image.

In an ideal case using the structured light technique, depth information would be determined for every point in the image. However, due to spot overlap, filling the entire image with spots makes determining spot sizes and/or locations difficult and/or impossible. A low-density pattern of spots is comparatively easier to locate in an image, and also allows for determination of variation in spot size. In other words, an auto-correlation function is sharper when using a low-density pattern. However, a low-density pattern does not provide depth information for every point in the image, which results in an incomplete and/or inaccurate image.

One technique for providing sufficient depth information, while preventing spot overlap, is to display multiple, different patterns (at different times). Here, the multiple patterns can, collectively, cover the image. However, since each pattern is displayed at a different time, spot overlap can be prevented. In some cases, an emitter array (e.g., a VCSEL array) may be used to produce such patterns (or portions of a repeated pattern).

SUMMARY

According to some possible implementations, an optical device may include: an array of vertical-cavity surface-emitting lasers (VCSELs) having a design wavelength, each VCSEL having an emission area; a first metal layer that substantially covers the array, the first metal layer including openings for each emission area; a second metal layer that substantially covers the first metal layer; an electrical isolation layer between the first metal layer and the second metal layer, the electrical isolation layer including vias for electrically connecting portions of the first metal layer and portions of the second metal layer; and a dielectric disposed over the emission area of each VCSEL, the dielectric over each emission area having a thickness and an area, wherein a variation in the thickness of the dielectric across at least approximately 90% of the area of the dielectric is less than approximately 2% of the design wavelength, and wherein a depth of a well formed by at least the first metal layer around the emission area of each VCSEL is equal to at least approximately 10% of a width of the emission area.

According to some possible implementations, an emitter array may include: an emitter array including a set of emitters and having a design wavelength, wherein each of the set of emitters has a respective emission area; a first metal layer, wherein the first metal layer substantially covers the emitter array, and wherein the first metal layer includes openings for each emission area; a second metal layer, wherein the second metal layer substantially covers the first metal layer; an electrical isolation layer, wherein the electrical isolation layer is between the first metal layer and the second metal layer, and wherein the electrical isolation layer includes vias for electrically connecting a portion of the first metal layer and portion of the second metal layer; and a dielectric over each emission area, wherein the dielectric over each emission area has a variation in a thickness across at least approximately 90% of an area of the dielectric that is less than approximately 2% of the design wavelength, and wherein a depth of a well formed by at least the first metal layer around the emission area is equal to at least approximately 10% of a width of the emission area.

According to some possible implementations, a vertical-cavity surface-emitting laser (VCSEL) may include: a first metal layer that includes an openings for an emission area of the VCSEL; a second metal layer that substantially covers the first metal layer; an electrical isolation layer between the first metal layer and the second metal layer, the electrical isolation layer either: including a via for electrically connecting a portion of the first metal layer and a portion of the second metal layer, or isolating the portion of the first metal layer from the portion of the second metal layer; and a dielectric disposed over the emission area, the dielectric over the emission area having a thickness and an area, wherein a variation in the thickness across at least approximately 90% of the area of the dielectric is less than approximately 2% of a design wavelength associated with the VCSEL, and wherein a depth of a well formed by at least the first metal layer around the emission area is equal to at least approximately 10% of a width of the emission area.

According to some possible implementations, a vertical-cavity surface-emitting laser (VCSEL) array may include: a first VCSEL to emit light on a non-epitaxial side of a substrate, wherein a contact of the first VCSEL is on an epitaxial side of the substrate and is electrically connected to a first metal layer, wherein the first metal layer is on the epitaxial side of the substrate and is formed substantially over the VCSEL array; and a second VCSEL to emit light on the non-epitaxial side of the substrate, wherein a contact of the second VCSEL is on the epitaxial side of the substrate and is electrically connected to a second metal layer, wherein the second metal layer is on the epitaxial side of the substrate and is formed substantially over the first metal layer.

According to some possible implementations, a vertical-cavity surface-emitting laser (VCSEL) array may include: a first VCSEL to emit light on an epitaxial side of a substrate, wherein a contact of the first VCSEL is on the epitaxial side of the substrate and is electrically connected to a first metal layer, wherein the first metal layer is on the epitaxial side of the substrate and is formed substantially over the VCSEL array, and wherein the first metal layer includes emission openings for the VCSELs of the VCSEL array; and a second VCSEL to emit light on the epitaxial side of the substrate, wherein a contact of the second VCSEL is on the epitaxial side of the substrate and is electrically connected to a second metal layer, wherein the second metal layer is on the epitaxial side of the substrate and is formed substantially over the first metal layer, and wherein the second metal layer includes emission openings for the VCSELs of the VCSEL array.

According to some possible implementations, a vertical-cavity surface-emitting laser (VCSEL) array may include: a first VCSEL to emit light on an emitting side of a substrate, wherein a contact of the first VCSEL is on an epitaxial side of the substrate and is electrically connected to a first metal layer, wherein the first metal layer is on the epitaxial side of the substrate and is formed substantially over the VCSEL array; and a second VCSEL to emit light on the emitting side of the substrate, wherein a contact of the second VCSEL is on the epitaxial side of the substrate and is electrically connected to a second metal layer, wherein the second metal layer is on the epitaxial side of the substrate and is formed substantially over the first metal layer. In some implementations, the emitting side of the substrate is the epitaxial side of the substrate, and the first metal layer and the second metal layer include emission openings for the first VCSEL and the second VCSEL. In some implementations, the emitting side of the substrate is a non-epitaxial side of the substrate.

DETAILED DESCRIPTION

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations. In the following detailed description, while layers may be described as being associated with or used by a single VCSEL, in some implementations, a VCSEL layer may be shared by VCSELs in a VCSEL array.

Some VCSEL arrays with multiple groups of emitters include a single layer (e.g., a single metal layer) for anode connections to each of the groups of emitters. A feature in such a VCSEL array is that electrically isolated anode connections to different groups of emitters of the VCSEL array do not overlap. For a VCSEL array with a relatively large pitch (e.g., a distance greater than 70 micrometers (μm)) between a given pair of emitters, there may be sufficient space between emitters such that different anodes can be routed among the emitters (e.g., such that a different group of emitters can be connected to each anode via the single metal layer). One such VCSEL array with such spacing is a typical VCSEL array for data communication, which may have a large pitch (e.g., 250 μm) commensurate with optical fiber spacing in connectors.

However, in some VCSEL arrays (e.g., a VCSEL array for 3D-sensing using the structured light technique or the time-of-flight technique, a VCSEL array for infrared (IR) illumination, and/or the like) a number of emitters may be large (e.g., in the hundreds), and there may be incentive to place the emitters as close as possible to one another (e.g., in order to reduce a cost or a size of a VCSEL die, which may be on a scale of approximately 1 to 2 millimeters (mm) per side). For example, it may be desirable that a pitch between a given pair of emitters is less than approximately 50 μm in such cases. As a result of this comparatively smaller pitch, routing between emitters of such VCSEL arrays may be difficult and/or impossible. Further, if relatively small electrical trace widths are used (e.g., in order to allow routing between VCSELs), these electrical traces may increase resistance and/or may add extra heating (e.g., since these VCSEL arrays typically require a several amperes of current).

When a VCSEL array includes a single group of emitters, a single anode typically powers all emitters of the VCSEL array (electrically in parallel), and the single group of emitters includes every emitter in the VCSEL array. In the case of a VCSEL with multiple groups of emitters, each of the groups of emitters can be powered by a respective anode of a group of anodes.

Figure 1A:
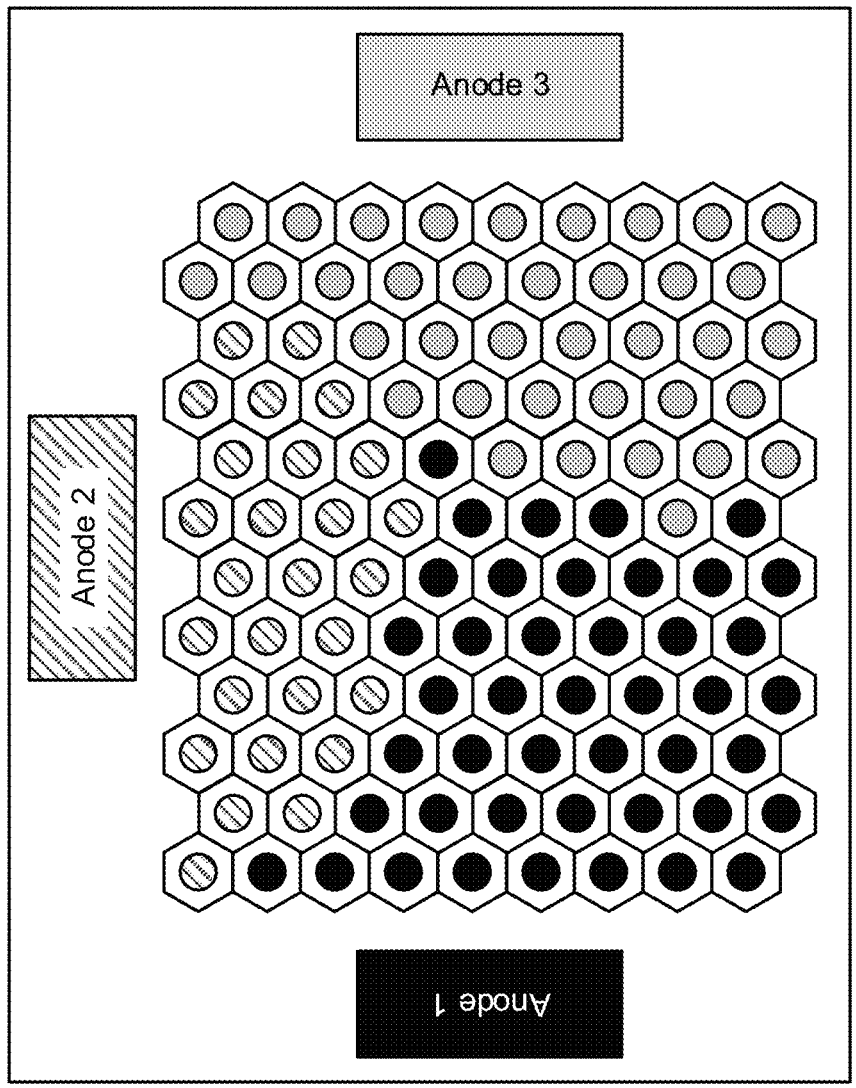
FIGS. 1A and 1B are diagrams depicting VCSEL arrays including a single metal layer for connecting anodes to respective groups of emitters.

FIG. 1A is a diagram illustrating a VCSEL array in which multiple groups of emitters (e.g., three groups of emitters are shown in FIG. 1A) are each powered by a different respective anode. As shown, in the VCSEL array shown in FIG. 1A, each group of emitters includes a cluster of adjacent emitters, and each emitter of a given cluster associated with a different anode. In this example, each of the groups of emitters can be connected to a respective anode using the same single metal layer. For example, a first portion of the metal layer may connect each emitter in a first group of emitters (e.g., emitters identified with black emission areas) to anode 1, a second portion of the metal layer may connect each emitter in a second group of emitters (e.g., emitters identified with diagonally hatched emission areas) to anode 2, and a third portion of the metal layer may connect each emitter in a third group of emitters (e.g., emitters identified with gray emission areas) to anode 3. Here, the different portions of the metal layer are isolated from one another in order to allow each of the three emitter clusters to be separately controlled (e.g., such that each group of emitters is independently addressable). Notably, while each of the groups of emitters is separately addressable via the same single metal layer in FIG. 1A, the clustering of emitters in each group may not be sufficient to provide patterns that are suitable for use in a structured light application (e.g., due to spot overlap, due to limited randomness, and/or the like).

Figure 1B:
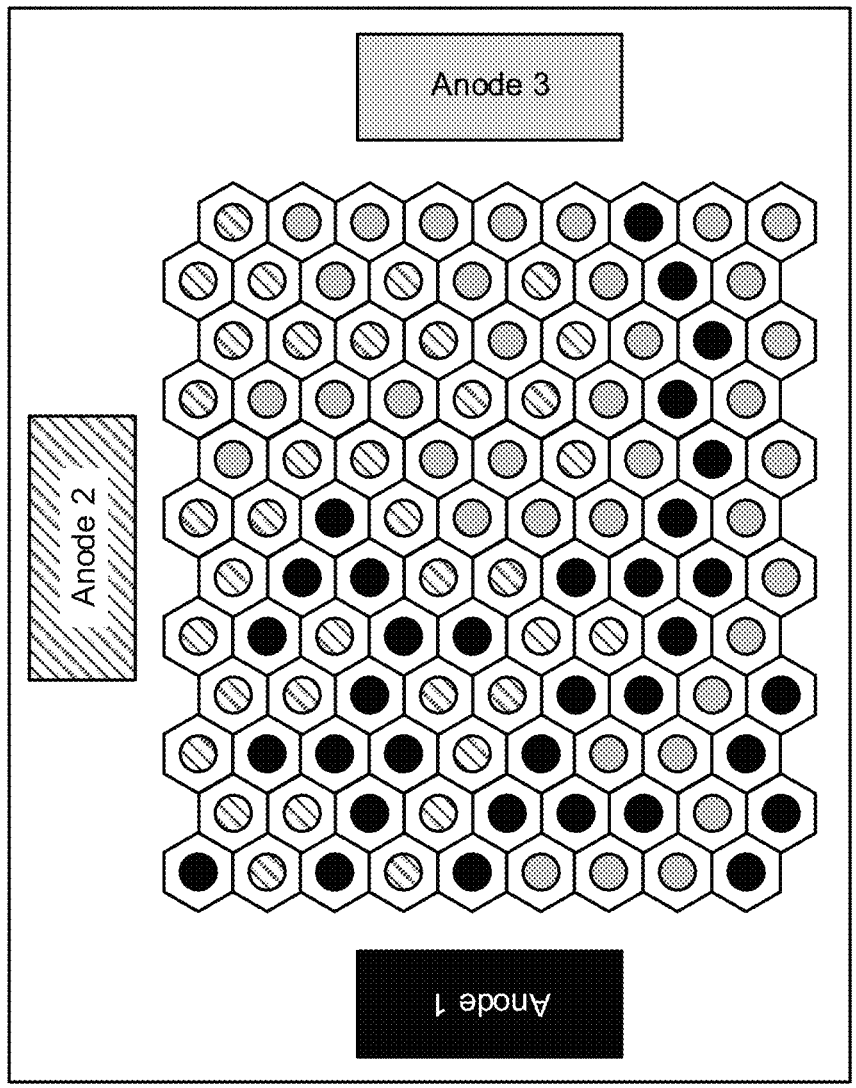

In some cases, in order to improve utility in a structured light application, groups of emitters may be comparatively more randomly distributed as illustrated, for example, in FIG. 1B. In the VCSEL array of FIG. 1B, emitters in a given group are strung together, and are associated with a respective anode. In the VCSEL array of FIG. 1B, a given emitter either adjacent to at least one other emitter in the given group, or is near a respective anode such that it can be directly connected to the respective anode. Due to this arrangement, it may be possible to connect each of the groups of emitters to an associated anode using the same single metal layer. In such a case, the single metal layer forms electrical paths through a series of adjacent emitters. For example, a first portion of the metal layer may form paths through strings of adjacent emitters in the first group of emitters such that each emitter in the first group of emitters is connected to anode 1, a second portion of the metal layer may form paths through strings of adjacent emitters in the second group of emitters such that each emitter in the second group of emitters is connected to anode 2, and a third portion of the metal layer may form paths through strings of adjacent emitters in the third group of emitters such that each emitter in the third group of emitters is connected to anode 3. Here again, the different portions of the metal layer are isolated from one another in order to allow each of the three emitter clusters to be separately controlled (e.g., such that each group of emitters is independently addressable). However, while such a configuration may work for some applications, this approach is generally undesirable. For example, electrical paths with a high ratio of length to width (e.g., 10 to 1 or higher, especially if the VCSEL array is a top emitting device in which an anode layer cannot cover emission areas of any VCSELs) have relatively high electrical resistance, which reduces electrical-to-optical efficiency of the VCSEL array. Thus, use of a single metal layer to form electrical paths along the strings of emitters may be unsuitable in practice. Further, in a structured light application, it may be desirable to utilize groups of emitters that are grouped in a comparatively more random pattern as compared to one in which groups of emitters comprise one or more "strings" of emitters, as illustrated in FIG. 1B. For example, in order to provide increased randomization, it may be desirable to have one or more emitters in a given group of emitters that is not adjacent to any other emitters in the given group of emitters.

Some implementations described herein provide an emitter array (e.g., a VCSEL array) including multiple metal layers that enable random groups of (separately addressable) emitters to be provided on a same die area (e.g., for use in a 3D-sensing application). In some implementations, the multiple metal layers increase efficiency in use of the die area (e.g., by permitting multiple groups of emitters to be provided on the same die area without an increase in minimum distance between emitters), thereby lowering die cost, optics cost, and/or assembly cost (e.g., as compared to using separate die areas). Additionally, the emitter array with multiple metal layers may have increased manufacturability and lower electrical resistance (thereby improving electrical-to-optical efficiency) as compared to a VCSEL array that uses a single metal layer described above.

Notably, the implementations described herein are described in the context of multiple anodes, each connected to a respective group of randomly arranged emitters. However, the implementations described herein can also be implemented for a case in which multiple cathodes, where each cathode is connected to respective group of randomly arranged emitters. The implementations are described in the context of multiple anodes since isolating a p-type side of a laser's light emitting p-i-n junction is typical, which is convenient when a p-type material is closest to an epitaxial surface (in which case an n-type material is common between adjacent emitters). Further, a substrate is typically n-type. In operation, the p-type side of the light emitting p-i-n laser junction is biased at higher voltage than the n-type side. Hence, the p-type material is connected to the anode and n-type to the cathode. However, it is possible to grow the epitaxial material so that the p-type side of the laser's p-i-n junction is closest to the substrate and to isolate emitters using the n-type (cathode). Such a design may require a p-type substrate or may be done by growth on a semi-insulating substrate or a substrate electrically isolated from the p-type material. The implementations described herein are still applicable in such a case, but in such cases the multiple metal layers of the VCSEL array may be associated with multiple cathodes (rather than multiple anodes).

Further, while the designs described herein are described in the context of VCSELs, these designs may be applied to another type of emitter and/or optical device, such as a light emitting diode (LED), or another type of vertical emitting (e.g., top emitting or bottom emitting) optical device. Additionally, the designs described herein may apply to VCSELs, other types of emitters, and/or other types of optical devices of any wavelength, power level, emission profile or the like. In other words, the designs described herein are not particular to a VCSEL, other types of emitters, or optical devices with a given performance characteristic.

Figure 2A:
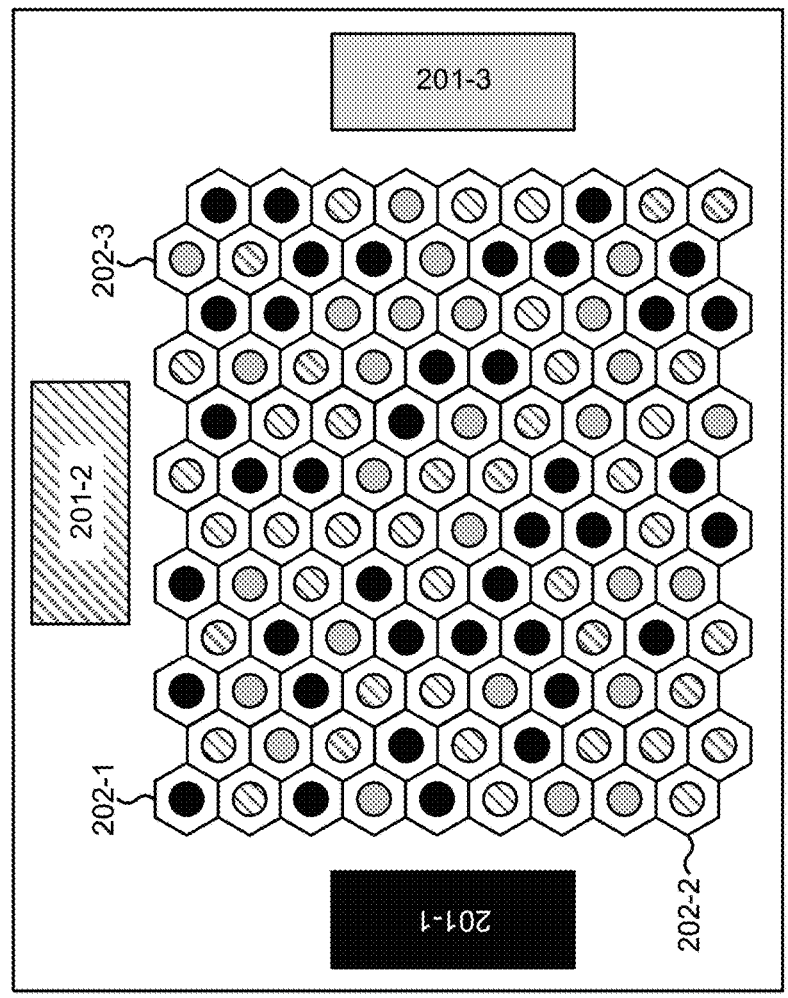
FIGS. 2A-2I are diagrams associated with an emitter array that includes multiple metal layers for connecting randomly arranged groups of emitters to respective anodes.

FIG. 2A is a diagram associated with an emitter array 200 that includes multiple metal layers for connecting arbitrarily chosen groups of emitters, arranged on a regular lattice, to respective anodes. As shown in the top view of FIG. 2A, emitter array 200 may include multiple groups of emitters (e.g., a randomly arranged group of emitters 202-1, a randomly arranged group of emitters 202-2, and a randomly arranged group of emitters 202-3), each associated with a respective anode 201 (e.g., anode 201-1, anode 201-2, and anode 201-3). As shown, each group of emitters 202 includes emitters 202 that are arbitrarily arranged throughout the emitter array (e.g., rather than being clustered or strung together as in the VCSEL arrays that include a single metal layer described above). In some implementations, such patterning may be suitable for use in a 3D sensing application that uses the structured light technique described above.

Notably, if emitters in such randomly arranged groups were powered using a single metal layer to connect to the anodes, narrow traces would be required (possibly too narrow for typical fabrication tolerances) between some emitters, and these narrow traces would also break electrical connections to nearby emitters, further increasing resistance. However, by using multiple metal layers, as described below, these limitations are avoided.

Notably, while the example shown in FIG. 2A shows emitters located in a regular pattern and randomly associated with a given group of emitters, the VCSEL design improvements described herein also can be applied to an array in which both the location of the emitters and their association with a particular group is non-random or quasi-random. Additionally, while the example shown in FIG. 2A shows the emitter array in a regular or lattice pattern, the VCSEL design improvements described herein also can be applied to a non-lattice (e.g., random, pseudo-random or irregular) emitter array.

Figure 2B:
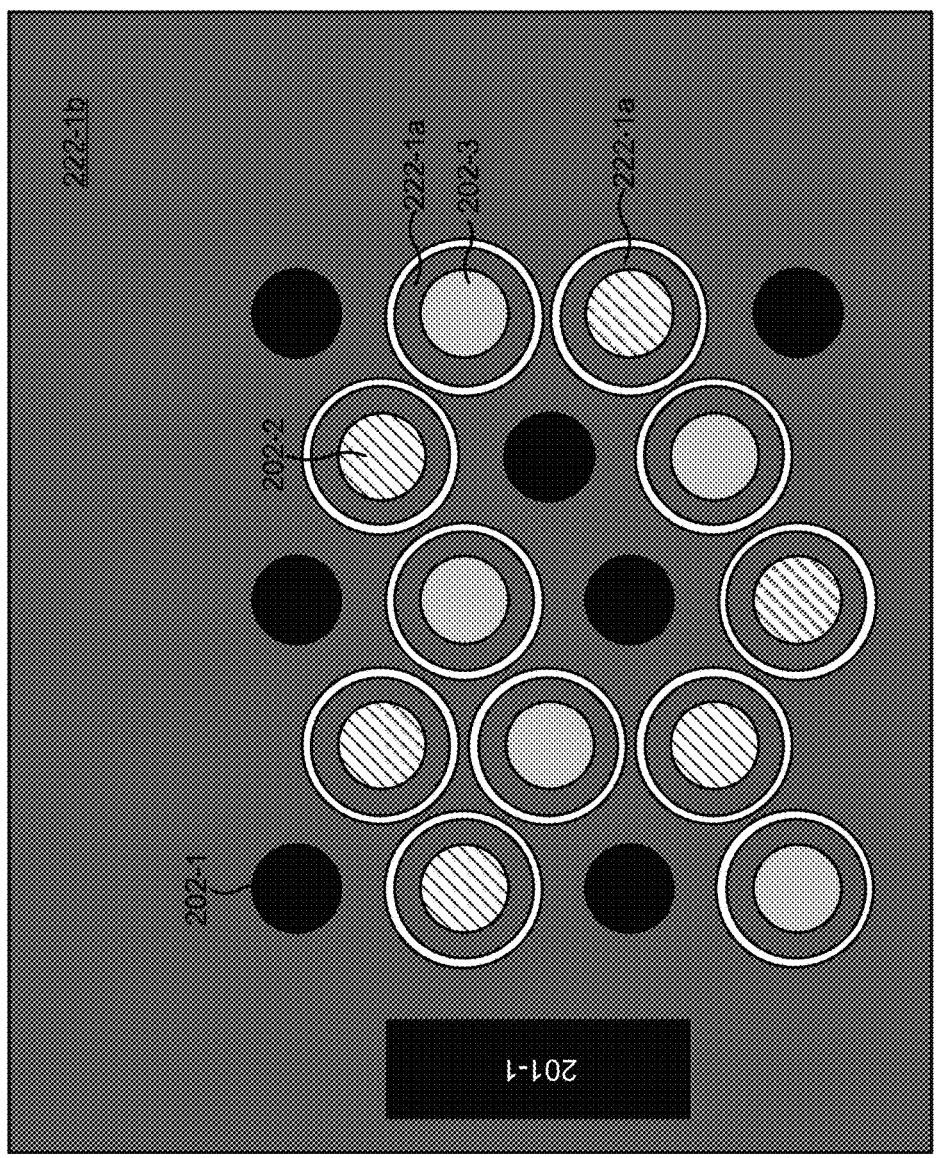
Figure 2C:
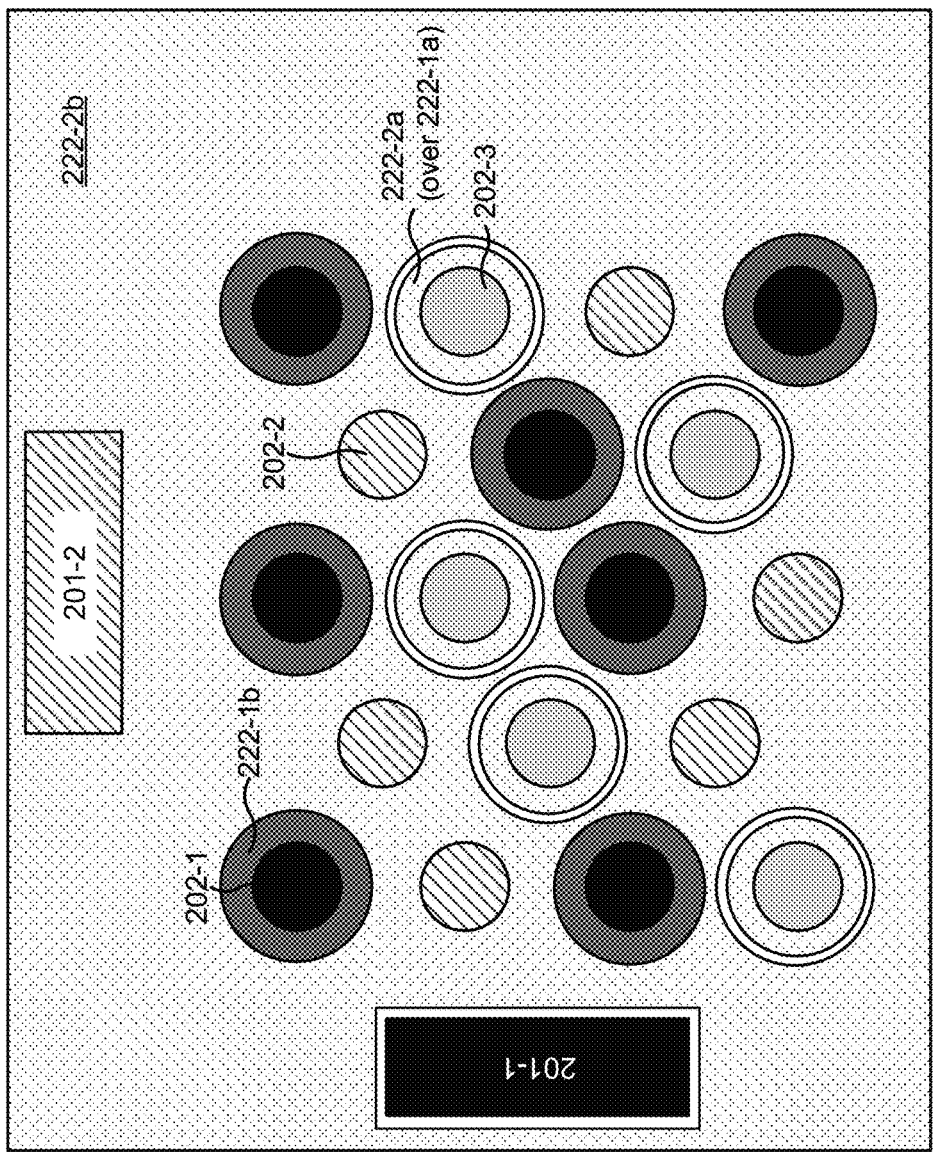
Figure 2D:
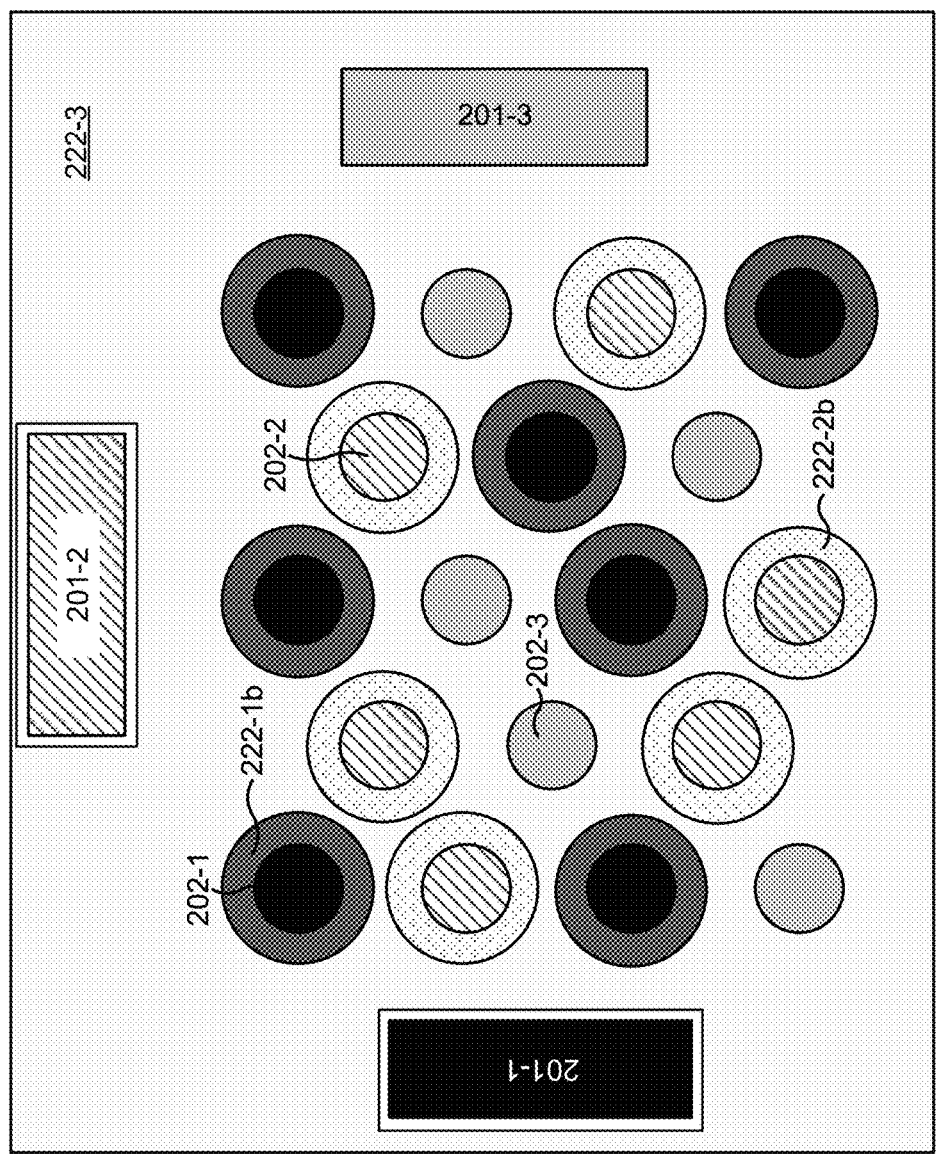

FIGS. 2B-2D illustrate an example of a manner in which multiple metal layers can be used in order to connect each of the groups of emitters 202 to a respective anode 201. Notably, FIGS. 2B-2D illustrate an emitter array 200 including top-emitting emitters 202. An example of a bottom emitting emitter array 200 is described below with regard to FIGS. 4A-4C.

As shown in FIG. 2B, a metal layer 222-1 may be formed. As shown, metal layer 222-1 may be formed to include openings (ring-shaped openings are shown) such that portions of metal layer 222-1 over emitters 202 to be contacted by higher metal layers 222 (e.g., portions of metal layer 222-1 over a contact layer of emitters 202-2 and emitters 202-3, identified as metal layer portions 222-1a) are isolated from the remainder of metal layer 222-1b. The openings prevent emitters 202-2 and emitters 202-3, (which will be connected to anode 201-2 and anode 201-3, respectively) from being connected to anode 201-1. As further shown, the remainder of metal layer 222-1 (identified as metal layer 222-1b) connects (e.g., via a contact layer associated with each emitter 202-1) each of a group of emitters 202-1 (e.g., identified with black emission areas) to anode 201-1. Here, an electrical path from anode 201-1 to a given emitter 202-1 passes through metal layer 222-1b.

As further shown, since emitters 202 are top-emitting, an emission area of each emitter 202 is not covered by any portion of metal layer 222-1 (i.e., each metal layer portion 222-1a includes an emission opening over a respective emitter 202 emission area, metal layer 222-1b includes emission openings over emission areas of emitters 202-1). In some implementations, the emission openings include circular openings (e.g., as shown in FIGS. 2B-2D), hexagonal openings, or openings of another shape. In some implementations, an isolation layer (not shown) is deposited on metal layer 222-1b in order isolate to metal layer 222-1b from a metal layer deposited after metal layer 222-1b, as described below.

As shown in FIG. 2C, a metal layer 222-2 may be formed in relation to metal layer 222-1 (e.g., above or after metal layer 222-1). As shown, metal layer 222-2 may be formed to include openings (ring-shaped openings are shown) such that portions of metal layer 222-2 over emitters 202-3 to be contacted by higher metal layers 222 (e.g., portions of metal layer 222-2 over metal layer portions 222-1a, identified as metal layer portions 222-2a) are isolated from the remainder of metal layer 222-2. The openings prevent, for example, emitters 202-3 from being connected to anode 201-2. As further shown, the remainder of metal layer 222-2 (identified as metal layer 222-2b) connects (e.g., via metal layer portions 222-1a and a contact layer) each of a group of emitters 202-2 (e.g., identified with diagonally hatched emission areas) to anode 201-2. Here, an electrical path from anode 201-2 to a given emitter 202-2 passes through metal layer 222-2b and a respective metal layer portion 221-1a. Anode 201-1 is electrically isolated from metal layer 222-2 (e.g., by a further opening in metal layer 222-2).

As further shown, since emitters 202 are top-emitting, an emission area of each emitter 202 is not covered by any portion of metal layer 222-2 (i.e., each metal layer portion 222-2a includes an emission opening over a respective emitter 202 emission area, metal layer 222-2b includes emission openings around emitters 202-1). In some implementations, the emission openings include circular openings (e.g., as shown in FIGS. 2B-2D), hexagonal openings, or openings of another shape. In some implementations, an isolation layer (not shown) is deposited on metal layer 222-2b in order to isolate metal layer 222-2b from a metal layer deposited after metal layer 222-2b, as described below.

As shown in FIG. 2D, a metal layer 222-3 may be formed in relation to metal layers 222-1 and 222-2 (e.g., above or after metal layer 222-2). As shown, metal layer 222-3 may be formed such that metal layer 222-3 connects (e.g., via metal layer portions 222-2a, metal layer portions 222-1a, and a contact layer) each of a group of emitters 202-3 (e.g., identified with gray emission areas) to anode 201-3. Here, an electrical path from anode 201-3 to a given emitter 202-3 passes through metal layer 222-3, a respective metal layer portion 222-2a, and a respective metal layer portion 221-1a. Anode 201-1 and anode 201-2 are electrically isolated from metal layer 222-3 (e.g., by further openings in metal layer 222-3).

As further shown, since emitters 202 are top-emitting, an emission area of each emitter 202 is not covered by any portion of metal layer 222-3 (i.e., metal layer 222-3 includes emission openings around all emitters 202). In some implementations, the emission openings include circular openings (e.g., as shown in FIGS. 2B-2D), hexagonal openings, or openings of another shape. In some implementations, an isolation layer (not shown) is deposited on metal layer 222-2b.

In this way, multiple metal layers 222 of an emitter array 200 (e.g., a VCSEL array) may enable groups of (separately addressable) arbitrarily arranged emitters 202 to be provided on a same die area without a need to increase a pitch between a given pair of emitters 202. Further, use of the multiple metal layers 222 may provide increased manufacturability and lower electrical resistance (thereby improving electrical-to-optical efficiency) as compared to a VCSEL array that uses a single metal layer. Additional details regarding emitters 202, the arrangement of metal layers 222, and other layers of emitters 202, are described below.

Figure 2E:
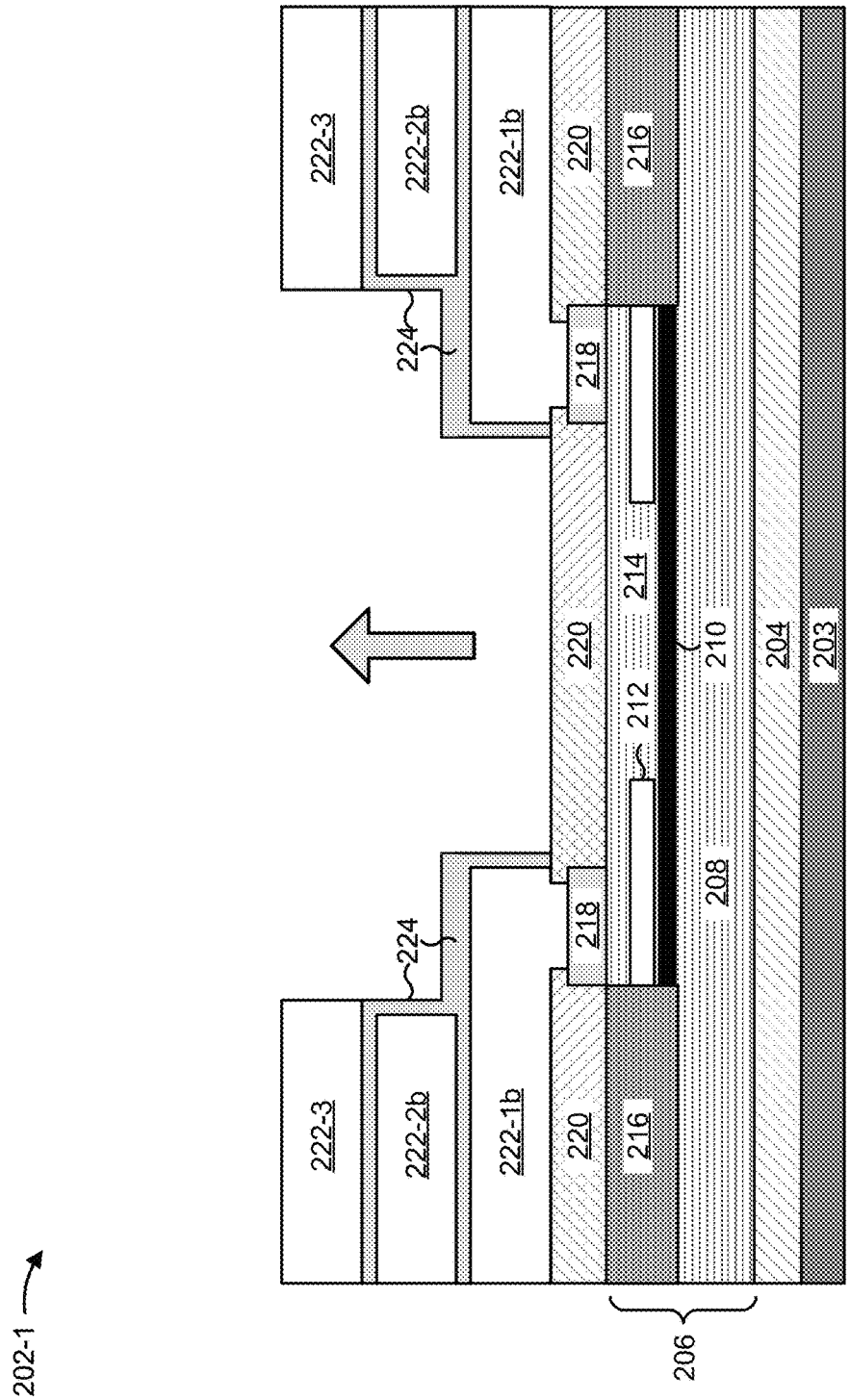
Figure 2F:
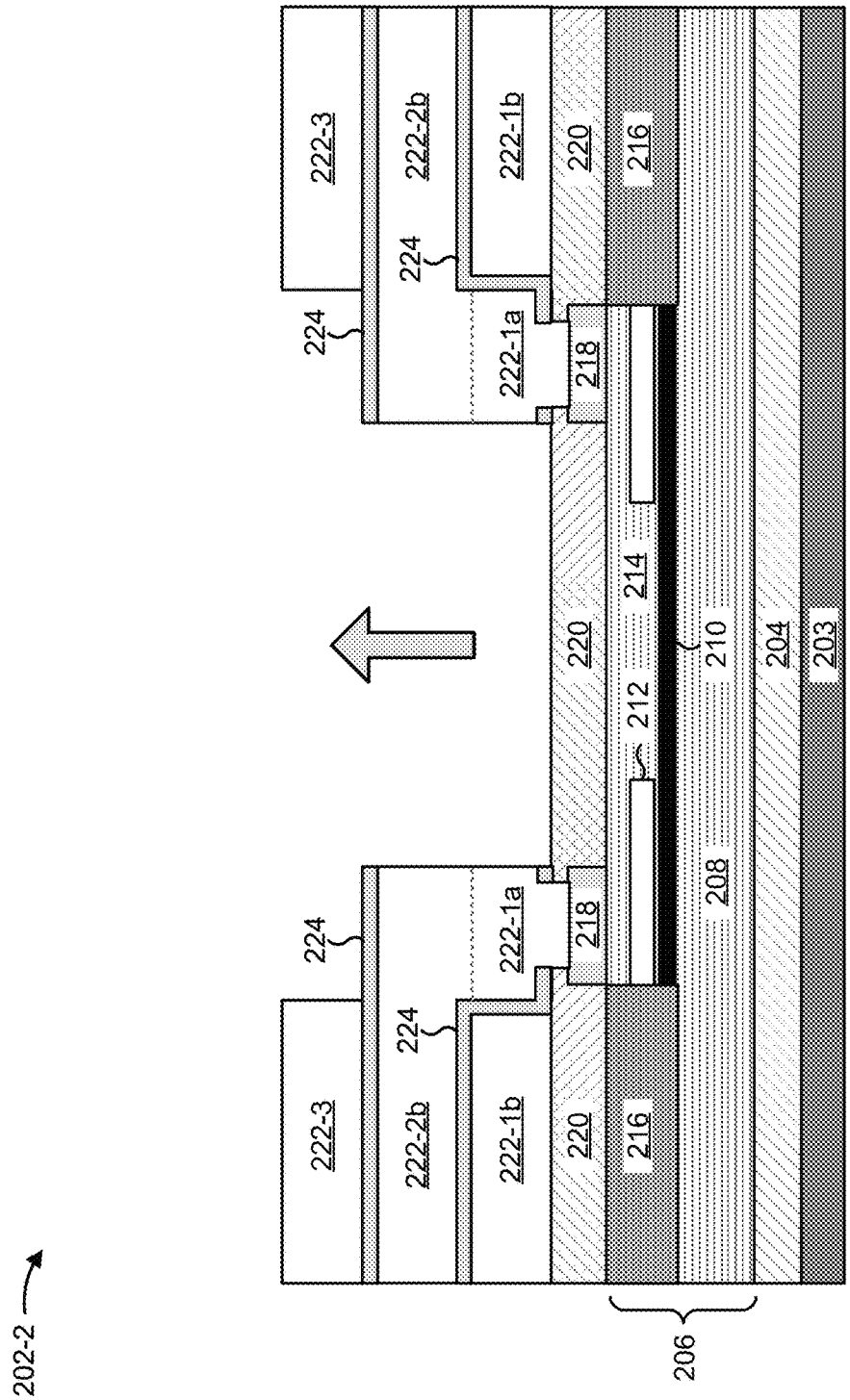
Figure 2G:
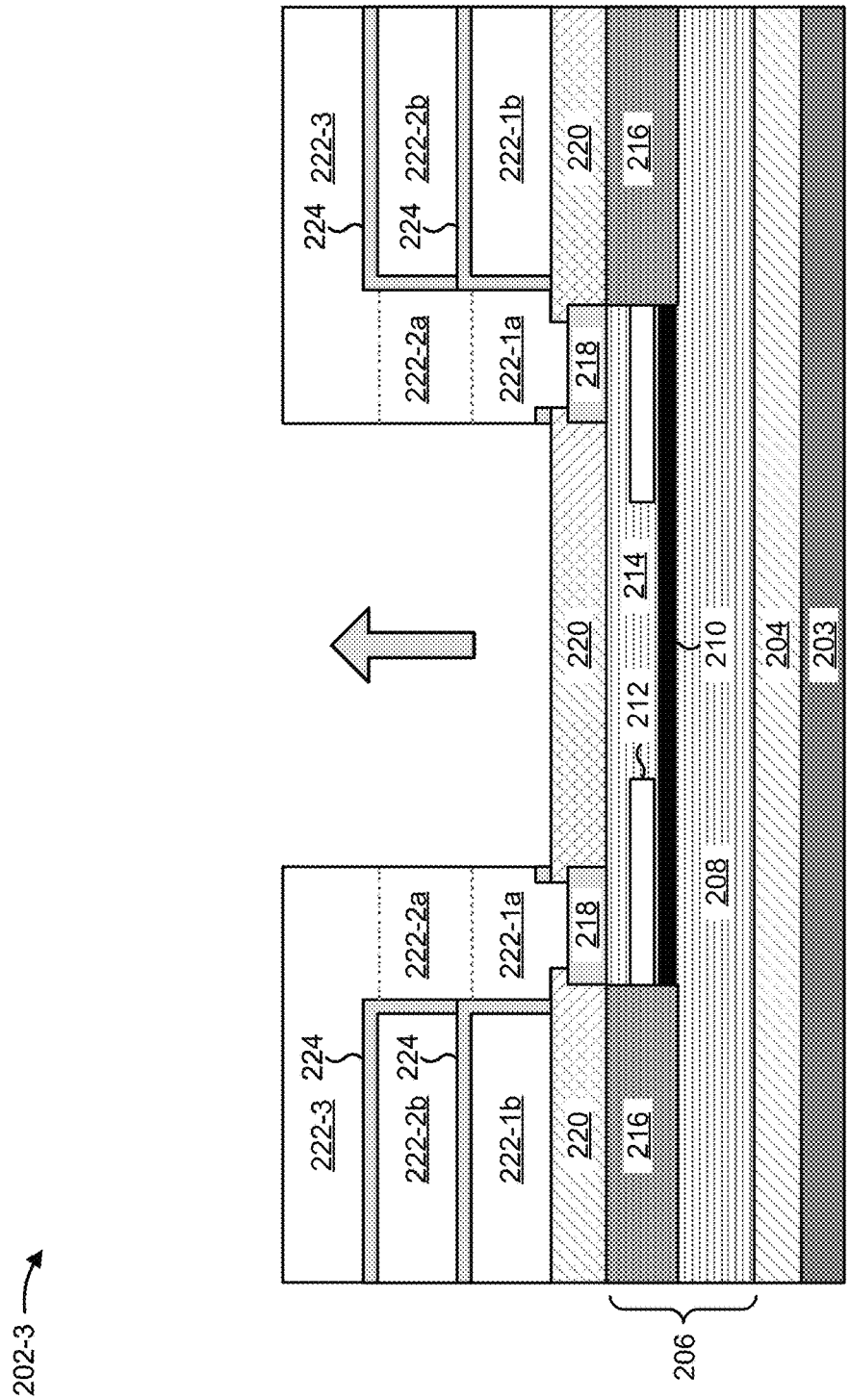

FIGS. 2E, 2F, and 2G are diagram illustrating example cross-sections of example emitters 202 with contacts associated with a first metal layer 222 of emitter array 200, a second metal layer 222 of emitter array 200, and a third metal layer 222 of emitter array 200, respectively. The metal layers 222 are separated by isolation layers, with vias through portions of the isolation layers to interconnect adjacent metal layers. FIGS. 2E, 2F and 2G illustrate a top emitting configuration of emitters 202. A bottom emitting configuration of emitters is also possible and is described in greater detail further below.

As shown in FIGS. 2E-2G, emitter 202 includes a backside layer 203, a substrate layer 204, epitaxial layers 206 (e.g., including a bottom mirror 208, an active region 210, an oxidation layer 212 (defining an oxidation aperture), a top mirror 214, and an isolation layer 216), a contact layer 218, a dielectric layer 220, a set of metal layers 222 (e.g., metal layers 222-1, 222-2, and 222-3), and isolation layers 224. As shown, arrangement of metal layers 222 and isolation layer 224 vary among the cross-sections of FIGS. 2E-2G, as described below. In some implementations, emitter 202 may be manufactured using a series of procedures. For example, one or more layers of emitter 202 may be created using one or more growth procedures, one or more deposition procedures, one or more etching procedures, one or more oxidation procedures, one or more implantation procedures, one or more metallization procedures, and/or the like.

Backside layer 203 includes a layer at a backside of an emitter. For example, backside layer can include an electrode layer that makes electrical contact with substrate layer 204 (e.g., a backside of substrate layer 204, shown as a bottom side of substrate layer 204 in FIG. 1A). As a particular example, backside layer 203 may include an annealed metallization layer, such as a Gold-Germanimum-Nickel (AuGeNi) layer, a Palladium-Germanium-Gold (PdGeAu) layer, and/or the like. In some implementations, backside layer 203 may be a cathode layer (e.g., when emitter array 200 includes multiple anodes) or an anode layer (e.g., when emitter array 200 includes multiple cathodes).

In the case of bottom-emitting emitters (e.g., emitters 402 shown and described below in association with FIGS. 4A-4G), portions of backside layer 203 over emission areas of bottom emitting emitters may include an anti-reflection coating, and elsewhere may be a metallic contact layer (e.g., an n-contact layer). In some implementations, backside layer 203 may have gaps between metallic portions and anti-reflective coated portions. In some implementations, the anti-reflective coating may partially cover some metallic portion of backside layer 203 where an electrical connection is not needed. For example, some metal may be deposited between the emitters in order to reduce resistance, and that metal may be covered by the anti-reflective coating.

Substrate layer 204 includes a substrate upon which epitaxial layers 206 are grown. In some implementations, substrate layer may be formed from a semiconductor material, such as GaAs, Indium Phosphide (InP), and/or another type of semiconductor material.

Epitaxial layers 206 include a set of layers grown on substrate layer 204. For example, epitaxial layers 206 may include an optical resonator including pair of reflectors (e.g., a pair of Distributed Bragg Reflectors (DBRs), a pair of dielectric mirrors, and/or the like) and an active gain medium (herein referred to as an active region), one or more layers used to form one or more apertures (e.g., for optical and/or electrical confinement), and/or the like, as described below. In some implementations, epitaxial layers 206 may include a set of AlGaAs layers grown on substrate layer 204 (e.g., a GaAs substrate). In some implementations, epitaxial layers 206 may be grown on substrate layer 204 using a Metal-Organic Chemical Vapor deposition (MOCVD) technique, a Molecular beam Epitaxy (MBE) technique, and/or the like. In some implementations, epitaxial layers 206 may have a thickness in a range from approximately 7 µm to approximately 16 µm, such as 8 µm or 13 µm. As shown, epitaxial layers 206 of emitter 202 may include bottom mirror 208, active region 210, oxidation layer 212, top mirror 214, and isolation layer 216.

Bottom mirror 208 includes a bottom reflector of an optical resonator of emitter 202. For example, bottom mirror 208 may include a distributed Bragg reflector (DBR), a dielectric mirror, and/or the like. In some implementations, bottom mirror 208 may have a thickness in a range from approximately 3.5 µm to approximately 9 µm, such as 5 µm.

Active region 210 includes one or more layers where electrons and holes recombine to emit light and define the emission wavelength range of the emitter 202. For example, active region 210 may include one or more quantum wells. The active region 210 also includes cavity spacer layers between top mirror 214 and bottom mirror 208. The optical thickness of active region 210 (including cavity spacer layers) and optical thickness of top mirror 214 and bottom mirror 208 define the resonant cavity wavelength of the emitter 202, which may be designed within an emission wavelength range of the active region to enable lasing. In some implementations, active region 210 may have a thickness in a range from approximately 0.06 µm to approximately 0.5 µm, such as 0.15 µm or 0.30 µm.

Oxidation layer 212 includes an oxide layer that provides optical and electrical confinement. In some implementations, oxidation layer 212 may be formed as a result of oxidation of one or more epitaxial layers. For example, oxidation layer 212 may be an Aluminum Oxide ($Al_2O_3$) layer formed as a result of oxidation of an epitaxial layer (e.g., an AlGaAs layer, an Aluminum Arsenide (AlAs) layer, and/or the like). In some implementations, oxidation layer 212 may have a thickness in a range from approximately 0.007 µm to approximately 0.04 µm, such as 0.02 µm. In some implementations, oxidation trenches 230 (not shown) etched around emitter 202 may allow steam to access the epitaxial layer from which oxidation layer 212 is formed. As shown, oxidation layer 212 may define an oxidation aperture (e.g., an optically active aperture). In some implementations, the oxide aperture may be a non-circular shape, but a circle of approximately the same area may have a diameter in a range from approximately 1 µm to approximately 300 µm, such as 5 µm or 8 µm.

Top mirror 214 includes a top reflector layer of emitter 202. For example, top mirror 214 may include a DBR, a dielectric mirror, and/or the like. In some implementations, top mirror 214 may have a thickness in a range from approximately 2 µm to approximately 6 µm, such as 4 µm.

Isolation layer 216 includes a layer that provides electrical isolation of emitter 202. For example, isolation layer 216 may include an ion implanted material, such as a Hydrogen implanted material or a Hydrogen/Proton implanted material. In some implementations, isolation layer 216 may be formed by applying an ion implanting process to one or more epitaxial layers grown on substrate layer 204. In some implementations, isolation layer 216 may have a thickness in a range from approximately 3 µm to approximately 7 µm, such as 5 µm.

Figure 3A:
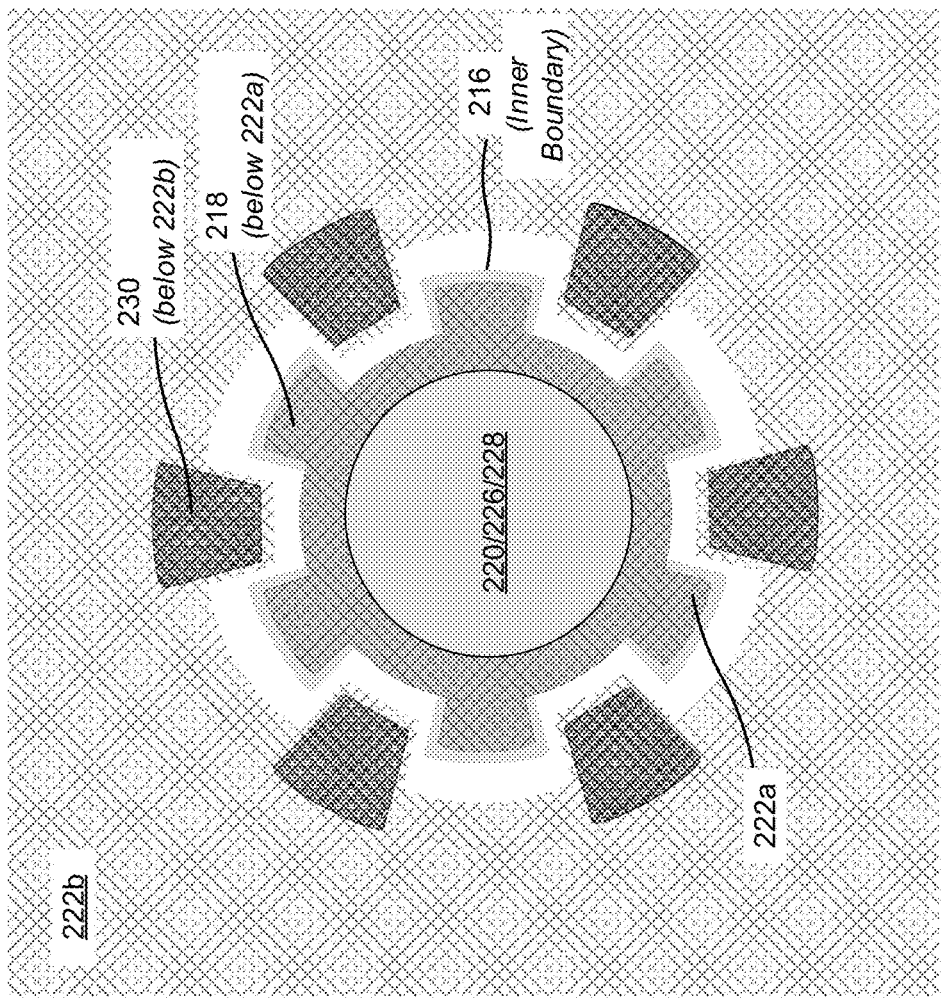
FIGS. 3A-3C are diagrams depicting top views of example arrangements of metal layers with respect to an emitter of the emitter array associated with FIGS. 2A-2I.
Figure 3B:
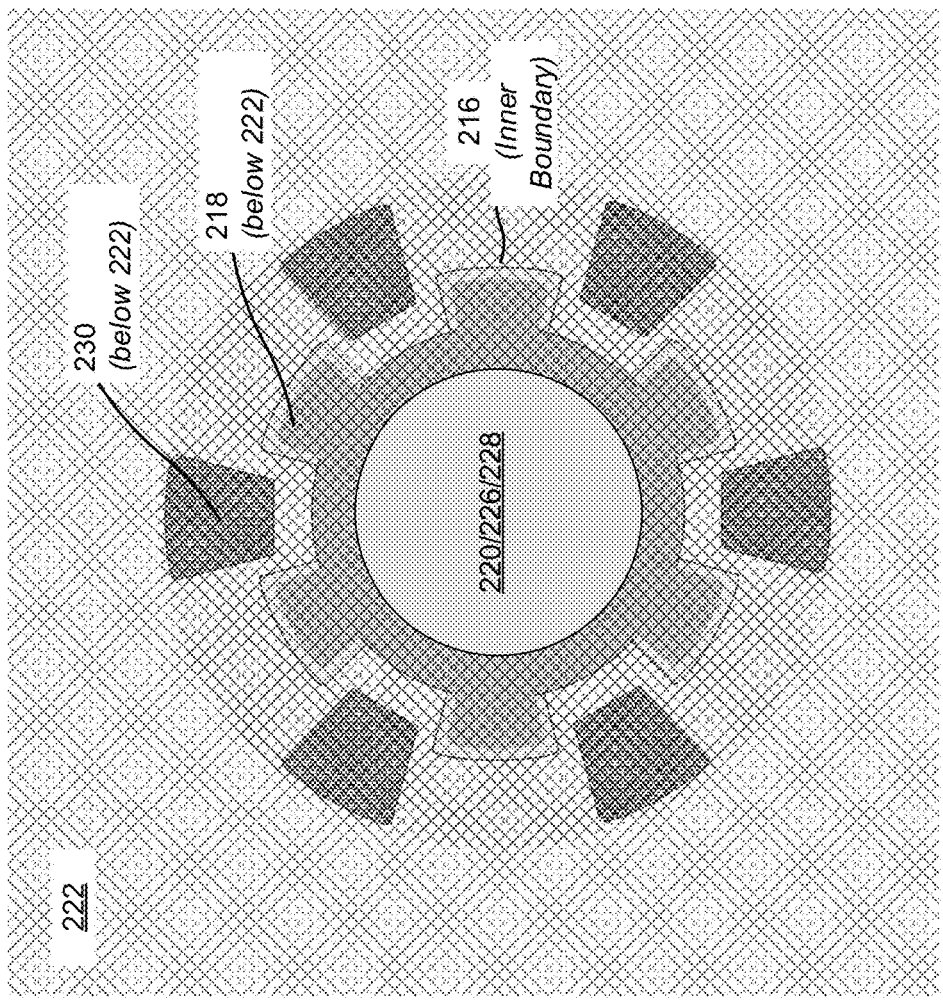
Figure 3C:
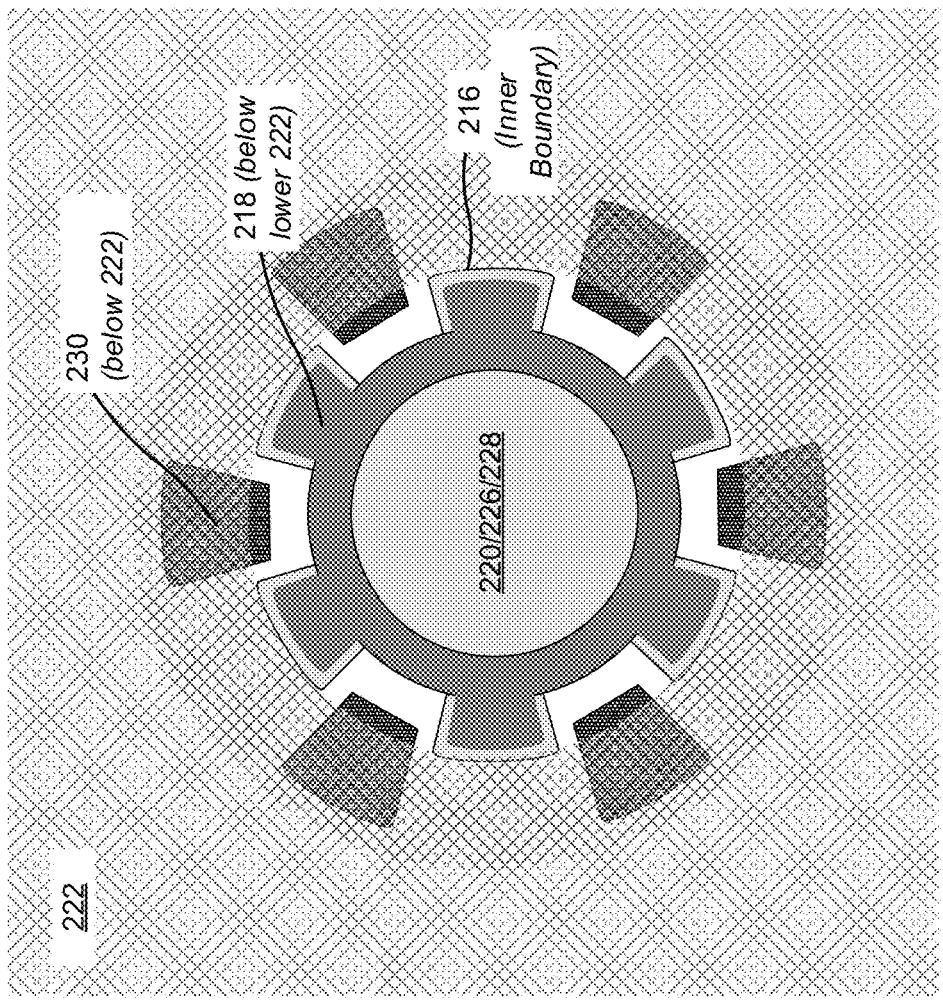

Contact layer 218 includes a layer that makes electrical contact with epitaxial layers 206 (e.g., top mirror 214) through which current may flow. Contact layer 218 may include an annealed metallization layer. For example, contact layer 218 may include a Chromium-Gold (Cr—Au) layer, Gold-Zinc (Au—Zn), a Titanium-Platinum-Gold (TiPtAu) layer, or the like, through which electrical current may flow. In some implementations, contact layer 218 may have a thickness in a range from approximately 0.03 µm to approximately 0.3 µm, such as 0.2 µm. In some implementations, contact layer 218 may have a ring shape, a slotted ring shape, a tooth wheel shape (e.g., as illustrated in FIGS. 3A-3C), or another type of circular or non-circular shape (e.g., depending on a design of emitter 202). While not shown, in some implementations, contact layer 218 is deposited such that contact layer 218 does not extend over or into a cavity used for oxidation, etching, and/or the like. In some implementations, contact layer 218 may be electrically connected to anode 201 through one or more metal layers 222, as described herein.

Dielectric layer 220 includes a layer that acts as a protective passivation layer and/or that acts as an additional DBR. For example, dielectric layer 220 may include one or more sub-layers (e.g., a Silicon Dioxide (SiO$_2$) layer, a SiNx layer, and/or the like) deposited on one or more epitaxial layers 206 of emitter 202 (e.g., isolation layer 216 and top mirror 214). In some implementations, dielectric layer 220 may be a conformal coating in order to protect exposed semiconductor which may be along trench sidewalls or shadowed by other features which a non-conformal coating (e.g., as by an evaporation) would not protect with any appreciable thickness. For example, dielectric layer 220 may be a dielectric that is deposited by sputtering or deposited by chemical vapor deposition (CVD), such as plasma-enhanced CVD (PECVD). In some implementations, dielectric layer 220 may have a thickness in a range from approximately 0.08 to approximately 2 um.

As shown, dielectric layer 220 may include one or more vias (e.g., formed by etching) for electrically connecting portions of metal layer 222-1 and contact layer 218. As further shown, a portion of dielectric layer 220 over an emission area of emitter 202 may form an optical aperture (e.g., an aperture via which light may be emitted). In some implementations, the optical aperture may be defined by a diameter of the oxidation aperture, and an additional aperture may be formed in dielectric layer 220 for mode selectivity. In some implementations, the optical aperture may have a diameter in a range from approximately 2 μm to approximately 300 μm, such as 15 μm.

Metal layer 222 includes one or more metallic layers separated by dielectric layers 220 or isolation layers 224. One or more metallic layers may be provided for forming electrical connections between anode 201 and contact layer 218 (e.g., through vias in dielectric layer 220 or isolation layer 224). In some implementations, metal layer 222 may be relatively thick (e.g., with a thickness of at least approximately 1 nm, but typically less than approximately 5 μm) in order carry sufficient current, and may be plated. As shown, emitter 202 may include multiple metal layers 222 (e.g., metal layers 222-1 through 222-3). In some implementations, a depth of a well formed by at least metal layer 222 around the emission area of emitter 202 is equal to at least approximately 10% of a width of the emission area.

In some implementations, a portion of a given metal layer 222 may be deposited after a time at which another portion of the given metal layer 222 is deposited. For example, with reference to FIG. 2F, metal layer portion 222-1a (e.g., a portion that provides an electrical path from metal layer 222-2 to contact layer 218) may be deposited after metal layer 222-1b (e.g., a portion that is isolated from metal layer 222-2). In such a case, metal layer portion 222-1a may be deposited at a same time as metal layer 222-2.

Alternatively, a portion of a given metal layer 222 may be deposited or formed at the same time as another portion of the given metal layer 222. For example, again with reference to FIG. 2F, metal layer portion 222-1a may be deposited at the same time as metal layer portion 222-1b. In such a case, metal layer portions 222-1a and metal layer 222-1b may be deposited as a single metal layer 222-1. Next, an opening may be etched or otherwise formed in the single metal layer 222-1 (e.g., down to dielectric layer 220, down to contact layer 218) in order to create separate metal layer portion 222-1a and metal layer 222-1b. In such a case, isolation layer 224 may be formed on surfaces of the opening between metal layer portion 222-1a and metal layer 222-1b (e.g., in order to isolate metal layer portion 222-1a from metal layer 222-1b). Here, metal layer 222-2 may be deposited on the isolation material in the opening in order to fill the opening, if needed. A similar approach may be used in other layers (e.g., in order to form metal layer portion 222-2a and metal layer 222-2b in emitter 202-2 of FIG. 2G).

In some implementations, metal layer 222 may substantially cover a layer immediately below metal layer 222 and may include openings for emission areas of emitters 202 of emitter array 200. For example, as shown in FIG. 2E, emitter 202 may include metal layer 222-1b that substantially covers epitaxial layers 206, and includes an opening for an emission area of emitter 202. As further shown, emitter 202 may include metal layer 222-2b that substantially covers metal layer 222-1b, and includes an opening for the emission area of emitter 202. Similarly, emitter 202 may include metal layer 222-3 that substantially covers metal layer 222-2b, and includes an opening for the emission area of emitter 202. As further shown, portions of a given metal layer 222 may be electrically isolated from portions of another metal layer 222 by an isolation layer 224. Notably, since emitter 202 is a top-emitting emitter, metal layers 222 are arranged with openings such that metal layers 222 do not block light from emitter 202 or any other emitters in the emitter array 200. In a bottom-emitting emitter configuration, such openings may not be necessary.

Multiple metal layers 222 enable multiple electrically isolated groups of emitters to be provided by emitter array 200 from a same die area, without restriction on a layout or a selection of emitters in a given group. For example, emitter array 200 may include multiple anodes 201 (e.g., anode 201-1, anode 201-2, and anode 201-3), each to power a group of emitters (which can be arbitrarily chosen among all emitters in the array, but which does not include emitters from other groups) (e.g., a group of emitters 202-1, a group of emitters 202-2, and a group of emitters 202-3, respectively) in the same die area, as described above in association with FIG. 2A. Here, each emitter 202-1 is electrically connected to anode 201-1 (and is not electrically connected to anode 201-2 or anode 201-3), each emitter 202-2 is electrically connected to anode 201-2 (and is not electrically connected to anode 201-1 or anode 201-3), and each emitter 202-3 is electrically connected to anode 201-3 (and is not electrically connected to anode 201-2 or anode 201-1).

As one example, if emitters 202-1 are to be connected to anode 201-1 through metal layer 222-1b, then emitters 202-1 may have a cross-section similar to that shown in FIG. 2E. Here, contact layer 218 of a given emitter 202-1 is contacted by metal layer 222-1b (through a via in dielectric layer 220). Continuing with this example, if emitters 202-2 are to be connected to anode 201-2 associated with metal layer 222-2, then emitters 202-2 may have a cross-section similar to that shown in FIG. 2F. Here, contact layer 218 of a given emitter 202-2 is contacted by metal layer 222-2b (through a metal layer portion 222-1a over the given emitter 202-2, a via in isolation layer 224, and a via in dielectric layer 220). Further, if emitters 202-3 are to be connected to anode 201-3 associated with metal layer 222-3, then emitters 202-3 may have a cross-section similar to that shown in FIG. 2G. Here, contact layer 218 of a given emitter 202-3 is contacted by metal layer 222-3 (through a metal layer portion 222-2a over the given emitter 202-3, a metal layer portion 222-1a over the given emitter 202-3, a via in isolation layer 224, and a via in dielectric layer 220).

In some implementations, an electrical path from a given emitter 202 to an associated anode 201 may pass through one or more metal layers 222, and isolation between electrical paths associated with different anodes 201 may be provided by portions of isolation layer 224. Thus, by appropriate arrangement of metal layers 222 and isolation layer 224, each emitter 202 can be powered by an associated anode 201 in order to enable multiple (arbitrarily chosen) groups of emitters from emitter array 200 to be present on a same die area. Further, since electrical connections are achieved using relatively thick metal layers 222, resistance associated with emitter array 200 is reduced, meaning that electrical-to-optical efficiency is increased. Additionally, since the configuration of metal layers can define the groups of emitters, the epitaxial growth of the array of emitters may not need to be changed when changing the configuration of the groups of emitters. In other words, a template VCSEL array may be grown which can later be configured (by defining the metal layers) for different groups of emitters or patterns of structured light.

Isolation layer 224 includes an electrical isolation layer (e.g., a dielectric layer) to electrically isolate a portion of a given metal layer 222 from a portion of another metal layer 222 (e.g., in order to isolate metal layer 222-1b from metal layer 222-2b, in order to isolate metal layer 222-2b from metal layer 222-3) or another portion of the given metal layer 222 (e.g., in order to isolate a metal layer portion 222-1a from metal layer 222-2b, in order to isolate a metal layer portion 222-2a from metal layer 222-2b). In some implementations, a portion of isolation layer 224 may be disposed between a pair of metal layers 222 (e.g. in openings other than emission openings). In some implementations, isolation layer 224 may include vias for electrically connecting portions of a pair of metal layers 222. In some implementations, a portion of isolation layer 224 may be disposed between portions of a given metal layer 222 (e.g. in openings other than emission openings in order to electrically isolate one portion of the given metal layer 222 from another portion of the given metal layer 222).

In some implementations, isolation layer 224 may need to be a conformal layer in order to provide adequate electrical insulation. For example, since plated metal layers are not typically smooth, isolation layer 224 may be sputtered or deposited by CVD (e.g., PECVD) in order to achieve sufficient electrical isolation or dielectric coverage. In some implementations, isolation layer 224 may be deposited in multiple steps during manufacture of emitter array 200 (e.g., a portion of isolation layer may be deposited after a given metal layer 222 is deposited). In some implementations, isolation layer 224 may be the same as, or different from isolation layer 216 or dielectric layer 220.

For a top-emitting emitter, such as emitter 202, a thickness of a dielectric material over the emission area should be controlled, and variation of the thickness of the dielectric material across the emission area should be minimized (e.g., in order to allow emitter 202 to achieve acceptable optical performance). However, deposition of a dielectric material using a conformal technique (e.g., sputtering, deposition by CVD, and/or the like) tends to result in a conformal coating that varies in thickness at or near tall features (e.g., features with a height that is greater than approximately 0.5 μm). For example, our studies have found a thickness of a conformal coating near an edge of a feature that is taller than 1 μm may be as much as 20% thinner than a field thickness, and may include further variations across the emission area. Such variation in thickness is not acceptable for a dielectric material over the emission area that has thickness that is greater than a small fraction (e.g., less than approximately 50 nm) of a design wavelength for a design wavelength that is in a range from approximately 850 nm to approximately 1100 nm. This is problematic since a typical dielectric over the emission area in emitter 202 may need to have a thickness of at least approximately 100 nm in order to provide sufficient insulation and low capacitance.

Thus, since isolation layer 224 may need to be a conformal coating (in order to provide sufficient dielectric coverage) that is deposited after a portion of a given metal layer 222, and since metal layer 222 may be relatively thick (e.g., such that a well is formed by at least metal layer 222-1 around the emission area), variation of thickness of dielectric material across the emission area of emitter 202 may be unacceptable if isolation layer 224 is present over the emission area.

When deposited as a conformal coating, isolation layer 224 may overlay the entire surface of the wafer/device and may fall directly upon dielectric layer 220. However, it is desired to remove isolation layer 224 from the emission area because of its variation in thickness. Commonly, such an isolation layer is formed from silicon dioxide, silicon nitride, silicon oxynitride, and/or the like. Dielectric layer 220 may also be formed from silicon dioxide, silicon nitride, silicon oxynitride, and/or the like, since these materials are established in PECVD systems. However, there are no highly selective etches between these varieties of materials.

If a non-selective etch is used to remove isolation layer 224 when it rests above dielectric layer 220 in the emission area, then it is preferred to remove both isolation layer 224 and dielectric layer 220 over the emission area. Otherwise, the remaining portion of dielectric layer 220 may be of the similar non-uniform shape as isolation layer 224 and may have an unacceptable error in average thickness. However, removal of dielectric layer 220 in the emission area (without additional process steps) would leave the surface of the semiconductor exposed, which is a risk for device reliability (particularly in a moist environment).

Figure 2H:
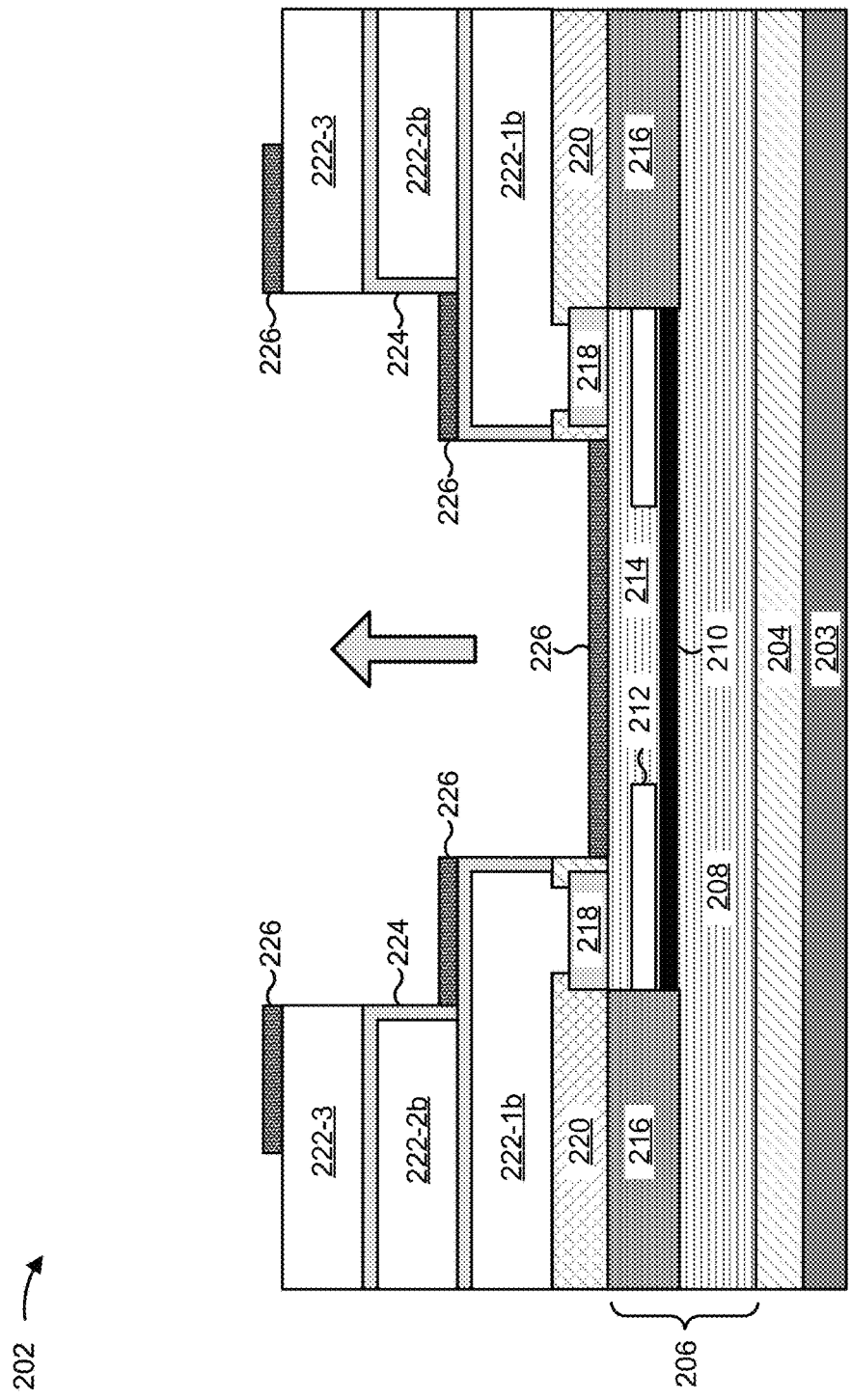

Exposure of the semiconductor surface in the emission area may be partially remedied by deposition of an additional coating. FIG. 2H is a diagram depicting a cross-section of alternative emitters 202 in which a thickness of a dielectric over the emission area can be controlled such that variation of the thickness of the dielectric across the emission area is minimized.

As shown in FIG. 2H, in some implementations, both isolation layer 224 and dielectric layer 220 may not be present over the emission area of emitter 202. Rather, as shown in FIG. 2H, emitter 202 may include a non-conformal coating 226 in the emission area. In some implementations, non-conformal coating 226 may be a relatively thick dielectric layer (e.g., a dielectric layer with a thickness that is greater than approximately 100 nm). In some implementations, non-conformal coating 226 may be deposited after a last metal layer 222 (e.g., after metal layer 222-3) using a non-conformal technique, such as evaporation. In some implementations, non-conformal coating may comprise SiO2, MgO, or another type of material suitable for deposition using a non-conformal technique. Here, since non-conformal coating 226 is non-conformal, variation in thickness of non-conformal coating 226 may not be significant across the emission area of emitter 202. Thus, dielectric thickness over the emission area can be controlled with minimal variation (e.g., such that the variation in the thickness of the dielectric across at least approximately 90% of the area of the dielectric in the emission area of emitter 202 is less than approximately 2% of the design wavelength).

As further shown in FIG. 2H, non-conformal coating 226 may be present on one or more other surfaces of emitter 202, in some cases. However, presence of non-conformal coating 226 on these surfaces may be optional and may not impact performance of emitter 202.

The removal of layer 220 over the emission area in FIG. 2H may have a slight lateral undercut and non-conformal coating 226, being non-conformal, may not adequately cover the resulting exposed semiconductor. In some implementations, in order to provide additional protection (e.g., from high humidity and/or high temperature), emitter 202 may include an ultra-thin film (not shown) over non-conformal coating 226 in the emission area. In some implementations, the ultra-thin film may be a dielectric layer with a thickness that is less than approximately 50 nm. In some implementations, the ultra-thin film may comprise $Al_2O_3$ or other another type of dielectric material. In some implementations, the ultra-thin film may be a coating deposited by atomic layer deposition (ALD). Notably, while ALD is conformal and may suffer the same non-uniformity in thickness as, for example, a PECVD coating, the ultra-thin film is sufficiently thin so that error in the optical thickness is negligible.

A variation on the above implementation is to remove layer 220 in the emission area and apply only a very thin ALD coating, as discussed above, without non-conformal coating 226. However, non-conformal coating 226 may provide additional lateral thermal conductivity (particularly in the case of MgO) which is desirable for improved device performance.

Although the implementation shown in FIG. 2H may achieve the desirable features of a uniform coating in the emission area and moisture resistance, it may require additional processing steps and deposition methods and materials not required for VCSELs with a single anode layer. As such, in some implementations, the emission area of emitter 202 may not have any thick conformal coating that is deposited after metal layers 222, but may retain a dielectric layer 220 over the emission area. For example, as shown in emitters 202 of FIGS. 2E-2G, isolation layer 224 may not be present over the emission area of emitter 202. Rather, only dielectric layer 220 (e.g., deposited before metal layer 222-1) may be present over the emission area. In this way, a thickness of a dielectric over the emission area can be controlled such that variation of the thickness of the dielectric across the emission area is minimized (e.g., such that the variation in the thickness of the dielectric across at least approximately 90% of the area of the dielectric in the emission area of emitter 202 is less than approximately 2% of the design wavelength). FIG. 2H has been illustrated in respect of an emitter 202 electrically connected to metal layer 222-1b. The non-conformal coating 226 of FIG. 2H may also be applied, if desired, to emitters electrically connected to other metal layers.

In some implementations, with reference to FIG. 2E, in order to provide additional protection (e.g., from high humidity and/or high temperature), emitter 202 may include a thin film coating (not shown) over dielectric layer 220 in the emission area, as described above.

Figure 2I:
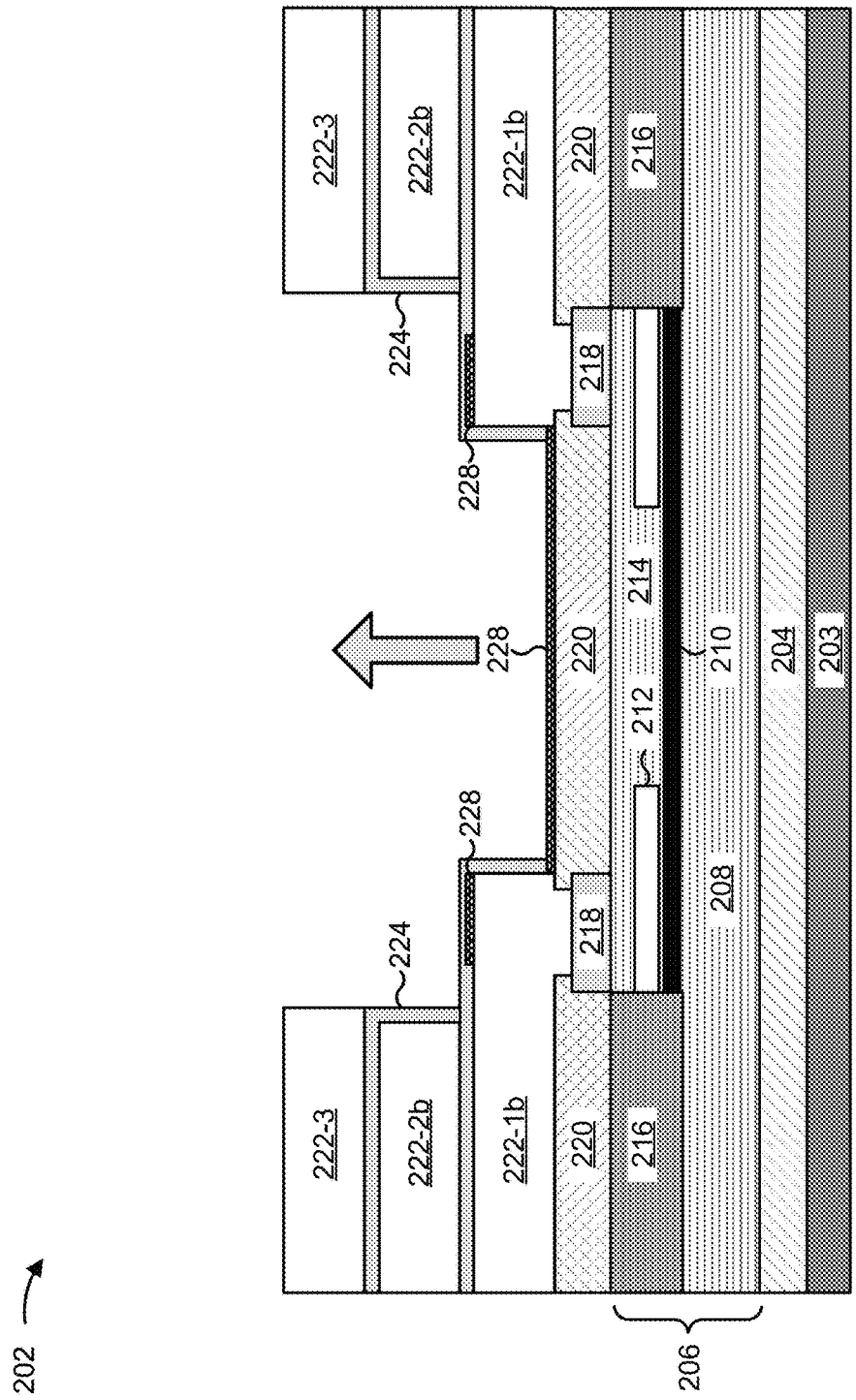

FIG. 2I is a diagram depicting a cross-section of an alternative emitter 202 in which a thickness of a dielectric over the emission area can be controlled such that variation of the thickness of the dielectric across the emission area is minimized.

As shown in FIG. 2I, in some implementations, isolation layer 224 may not be present over the emission area of emitter 202, while dielectric layer 220 and a second dielectric layer 228 may be present over the emission area. In some implementations, second dielectric layer 228 may be disposed on dielectric layer 220 in at least the emission area. In some implementations, second dielectric layer 228 serves as an etch-stop layer that prevents a portion of dielectric layer 220 in the emission area from being etched (e.g., such that the portion of dielectric layer 220 in the emission area is not etched during removal of a portion of isolation layer 224 from the emission area). For example, second dielectric layer 228 may be an $Al_2O_3$ layer that serves as an etch stop for etching of isolation layer 224 when isolation layer 224 comprises PECVD deposited SiN.

In some implementations, second dielectric layer 228 may be a non-conformal coating (e.g., deposited using evaporation). In some implementations, second dielectric layer 228 may be a conformal coating (e.g., deposited using ALD) with a thickness that is less than approximately 5% of the design wavelength of emitter 202. In some implementations, second dielectric layer 228 may be deposited after metal layer 222-1 and before metal layer 222-2 (e.g. before depositing a first of isolation layer 224).

Here, since second dielectric layer 228 is a non-conformal coating or an ultra-thin conformal coating, variation in thickness of dielectric material (e.g., a thickness of dielectric layer 220 plus a thickness of second dielectric layer 228) may not be significant across the emission area of emitter 202. Thus, dielectric thickness over the emission area can be controlled with minimal variation (e.g., such that the variation in the thickness of the dielectric across at least approximately 90% of the area of the dielectric in the emission area of emitter 202 is less than approximately 2% of the design wavelength).

As further shown in FIG. 2I, second dielectric layer 228 may be present on one or more other surfaces of emitter 202, in some cases. However, presence of second dielectric layer 228 on these surfaces may not impact performance of emitter 202. In some implementations, in order to provide additional protection (e.g., from high humidity and/or high temperature), emitter 202 may include an ultra-thin film (not shown) over second dielectric layer 228 in the emission area, as described above. FIG. 2I has been illustrated in respect of an emitter 202 electrically connected to metal layer 222-1b. The second dielectric layer 228 of FIG. 2I may also be applied, if desired, to emitters electrically connected to other metal layers.

In some implementations, second dielectric layer 228 may be removed in the emission area where second dielectric layer 228 lies on top of dielectric layer 220. The final device emissions area then appears like that in FIG. 2E. However, second dielectric layer 228 may remain in other regions, such as beneath isolation layer 224.

Another implementation is to construct dielectric layer 220 (e.g., before deposition of a first of metal layer 222) partially or entirely with a coating that serves as a stop-etch layer. For example, dielectric layer 220 may include a lower layer of a conformal coating, such as silicon nitride, and an upper layer of $Al_2O_3$ (e.g., deposited by ALD or by evaporation) that serves as an etch stop for etching of isolation layer 224 (e.g., when isolation layer 224 comprises PECVD deposited SiN or a similar material, such as silicon oxynitride or silicon nitride). The resulting device cross-section appears as in FIGS. 2E-2G. However, dielectric layer 220 may be thinner in the emission area, if the stop-etch layer is not the uppermost layer within dielectric layer 220.

The number and arrangement of layers shown in FIGS. 2A-2I are provided as an example. In practice, emitter array 200 may include additional emitters 202, fewer emitters 202, different emitters 202, differently arranged emitters 202, and/or the like, than those shown in FIG. 2A. Similarly, emitter 202 may include additional layers, fewer layers, different layers, differently arranged layers, layers with different thicknesses or relative thicknesses, and/or the like, than those shown in FIGS. 2A-2I. For example, emitter 202 may include a different number (e.g., two, more than three) and/or arrangement of metal layers 222 than shown and described in association with in FIGS. 2B-2I. Further, while three metal layers 222 are shown for three anodes 201, it may also be possible to combine some connections on a single layer. In other words, a number of metal layers 222 may not be equal to (e.g., may be less than) a number of anodes 201, in some implementations. In some implementations, multiple anodes 201 may connect to the same group of emitters. Additionally, a set of layers (e.g., one or more layers) of emitter 202 may perform one or more functions described as being performed by another set of layers of emitter 202.

FIGS. 3A-3C are diagrams depicting top views of additional example arrangements of metal layers 222 with respect to top-emitting emitter 202. Notably, for illustrative purposes, only a single metal layer 222 is illustrated, while other metal layers 222 may be present, as described below with regard to each of FIGS. 3A-3C.

FIG. 3A is a diagram depicting a top view of a first metal layer 222 with respect to emitter 202, where the illustrated first metal layer 222 does not connect to emitter 202. For purposes of illustrating the arrangement of the first metal layer 222, only the first metal layer 222 is shown in FIG. 3A, but other metal layers 222 may be present above and/or below the first metal layer 222. In the example shown in FIG. 3A, emitter 202 is to be contacted on another metal layer 222 that is above the first metal layer 222 in FIG. 3A. As shown, the first metal layer 222 may comprise a metal layer portion 222a and metal layer 222b. In FIG. 3A, metal layer 222a is a portion of the first metal layer 222 over contact layer 218 of emitter 202, and that is isolated from metal layer 222b. The first metal layer 222 may correspond to, for example, metal layer 222-1 in FIG. 2F (e.g., comprising metal layer portion 222-1a and metal layer 222-1b), metal layer 222-1 in FIG. 2G (e.g., comprising metal layer portion 222-1a and metal layer 222-1b), or metal layer 222-2 in FIG. 2G (e.g., comprising metal layer portion 222-2a and metal layer 222-2b).

As further shown, the first metal layer 222 may cover oxidation trenches 230 surrounding emitter 202. As further shown, metal layer 222b may be present over portions of isolation layer 216 (e.g., portions of isolation layer 216 outside of an inner boundary of isolation layer 216, as identified in FIG. 3A). In some implementations, a lateral distance between metal layer 222b and the inner boundary of isolation layer 216 may be at least approximately 0.5 μm. Further, no portion of the first metal layer 222 may be present over the emission area of emitter 202.

FIG. 3B is a diagram depicting a top view of a second metal layer 222 with respect to emitter 202, where the second metal layer connects to emitter 202. For purposes of illustrating the arrangement of the second metal layer 222, only the second metal layer 222 is shown in FIG. 3B, but other metal layers 222 may be present above and/or below the second metal layer 222. The second metal layer 222 of FIG. 3B may correspond to, for example, metal layer 222-1b in FIG. 2E, metal layer 222-2b in FIG. 2F, or metal layer 222-3 in FIG. 2G.

When the second metal layer 222 corresponds to metal layer 222-1b in FIG. 2E, the second metal layer 222 may be present over oxidation trenches 230 surrounding emitter 202, as well as portions of contact layer 218 (e.g., such that the second metal layer 222b contacts contact layer 218 through vias in a dielectric layer 220 (not shown)). When the second metal layer 222 corresponds to metal layer 222-2b in FIG. 2F, the second metal layer 222 may cover metal layer portion 222-1a over contact layer 218 and may be present over, but isolated from, metal layer 222-1b. Here, metal layer 222-2 is connected to contact layer 218 (through metal layer portion 222-1a and a via in dielectric layer 220 (not shown)). When the second metal layer 222 corresponds to metal layer 222-3 in FIG. 2G, the second metal layer 222 may cover metal layer portion 222-2a (which covers metal layer portion 222-1a over contact layer 218), and may be present over, but isolated from, metal layer 222-2b. Here, metal layer 222-3 is connected to contact layer 218 (through metal layer portion 222-2a, metal layer portion 222-1a, and a via in dielectric layer 220 (not shown)). Further, as shown, no portion of the second metal layer 222 may be present over the emission area of emitter 202.

FIG. 3C is a diagram depicting a top view of a third metal layer 222 with respect to emitter 202, where the third metal layer 222 does not connect to emitter 202. For purposes of illustrating the arrangement of the third metal layer 222, only the third layer 222 is shown in FIG. 3C, but other metal layers 222 may be present above and/or below the third metal layer 222. In the example shown in FIG. 3C, emitter 202 is to be contacted on another metal layer 222 that is below the third metal layer 222. For example, the third metal layer 222 of FIG. 3C may correspond to metal layer 222-3 in FIG. 2E, metal layer 222-2b in FIG. 2E, or metal layer 222-3 in FIG. 2F.

As shown in FIG. 3C, the third metal layer 222 may be present over oxidation trenches 230 surrounding emitter 202 and portions of isolation layer 216. In some implementations, as shown, the third metal layer 222 may not be present over portions of contact layer 218. Further, no portion of the third metal layer 222 may be present over the emission area of emitter 202.

As indicated above, FIGS. 3A-3C are provided merely as examples to illustrate possible arrangements of metal layers 222. Other examples are possible and may differ from what was described with regard to FIGS. 3A-3C.

In some implementations, an emitter array including bottom-emitting emitters may include multiple metals layers in order to provide arbitrarily groupings of emitters on the same die area (e.g., in order to enable random multi-patterned structured light to be provided, in a manner similar to that described above).

FIGS. 4A-4G are diagrams associated with an example emitter array 400 including emitters 402 that are bottom emitting. Emitter 402 may be similar in structure to emitter 202 with changes to make the emitter bottom emitting. For example, the mirror layers 214, 210 may be configured differently to allow emission out the bottom through substrate layer 204. However, dielectric layer 220 may not be present over the aperture and metal layers 222 of emitters 402 may be differently arranged. Emitter cross-sections showing more detail will be described for FIGS. 4D-4G.

For emitter array 400 with bottom-emitting emitters 402, metal layers 222 do not interfere with the laser light output (i.e., there is no need for metal layers 222 to have emission openings to avoid an emission area of emitter 402 since the emission area is on the bottom of emitter 402). FIGS. 4A-4D illustrate a manner in which emitters 402 in different groups can be connected to respective anodes 201 via multiple metal layers 222.

Figure 4A:
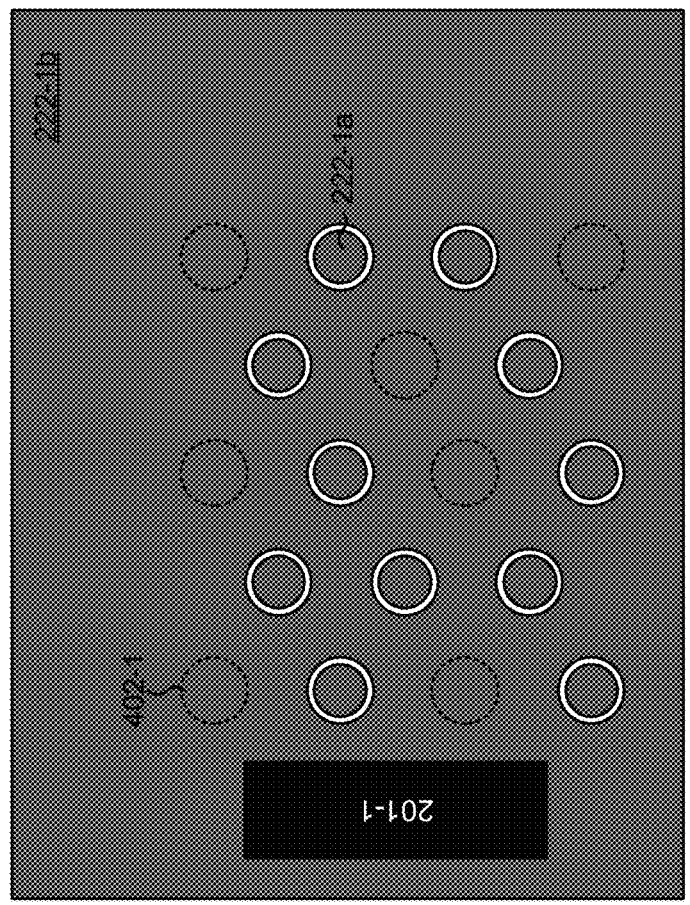
FIGS. 4A-4G are diagrams associated with an example emitter array, including bottom-emitting emitters, that includes multiple metal layers.

As shown in FIG. 4A, a metal layer 222-1, comprising metal layer portions 222-1a and metal layer 222-1b, may be formed. As shown, metal layer 222-1 may be formed to include openings (ring-shaped openings are shown) such that metal layer portions 222-1a over emitters 402 to be contacted by higher metal layers 222 are isolated from metal layer 222-1b. The openings prevent emitters 402-2 and emitters 402-3 (which will be connected to anode 201-2 and anode 201-3, respectively) from being connected to anode 201-1. As further shown, metal layer 222-1b connects (e.g., via a contact layer associated with each emitter 402-1) each of a group of emitters 402-1 (e.g., identified with dotted circles in FIG. 4A) to anode 201-1. Here, an electrical path from anode 201-1 to a given emitter 402-1 passes through metal layer 222-1b.

As further shown, since emitters 402 are bottom-emitting, an emission area of each emitter 402 may be covered by metal layer 222-1b or a metal layer portion 222-1a. In some implementations, an isolation layer (not shown) is deposited on metal layer 222-1b in order to isolate metal layer 222-1b from a metal layer deposited after metal layer 222-1b. In some implementations, isolation layer 224 is not formed on metal layer portions 222-1a over emitters 402 associated with other groups of emitters (e.g., in order to provide an electrical path to metal layer portion 222-1a).

Figure 4B:
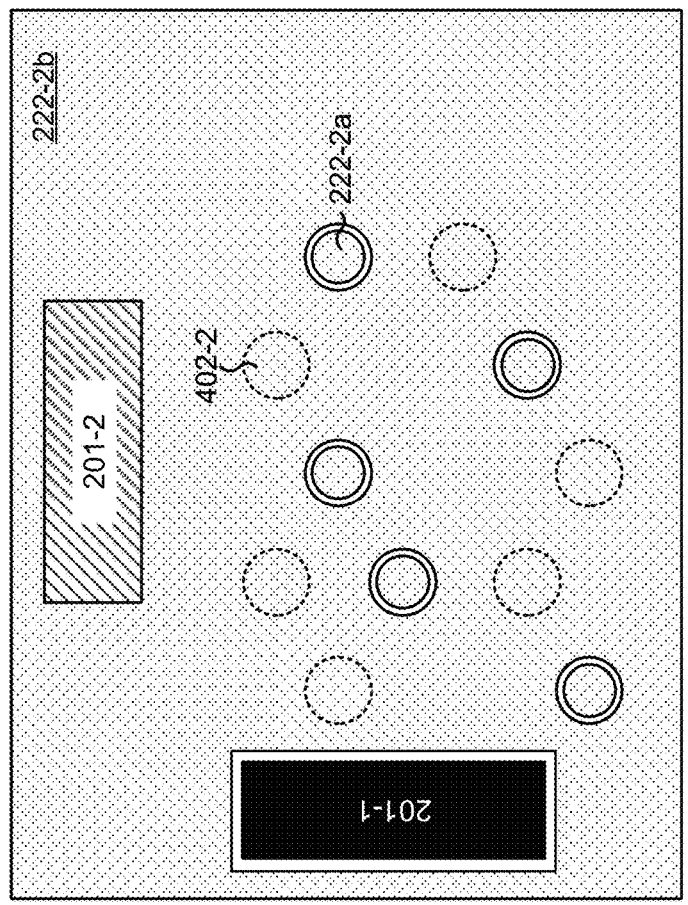

As shown in FIG. 4B, a metal layer 222-2, comprising metal layer portions 222-2a and metal layer 222-2b, may be formed. As shown, metal layer 222-2 may be formed to include openings (ring-shaped openings are shown) such that metal layer portions 222-2a over emitters 402 to be contacted by higher metal layers 222 are isolated from metal layer 222-2b. For example, the openings prevent emitters 402-3 (which may be connected to anode 201-3) from being connected to anode 201-2. As further shown, metal layer 222-2b connects (e.g., via a contact layer associated with each emitter 402-2 and a respective metal layer portion 222-1a over each emitter) each of a group of emitters 402-2 (e.g., identified with dotted circles in FIG. 4B) to anode 201-2. Here, an electrical path from anode 201-2 to a given emitter 402-2 passes through metal layer 222-2b and a metal layer portion 222-1a over the given emitter 402-2. Anode 201-1 is electrically isolated from metal layer 222-2 (e.g., by a further opening in metal layer 222-2).

As further shown, since emitters 402 are bottom-emitting, an emission area of each emitter 402 may be covered by metal layer 222-2b or a metal layer portion 222-2a. In some implementations, an isolation layer (not shown) is deposited on metal layer 222-2b in order to isolate metal layer 222-2b from a metal layer deposited after metal layer 222-2b. In some implementations, isolation layer 224 is not formed on metal layer portions 222-2a over emitters 402 associated with other groups of emitters (e.g., in order to provide an electrical path through metal layer portion 222-2a).

Figure 4C:
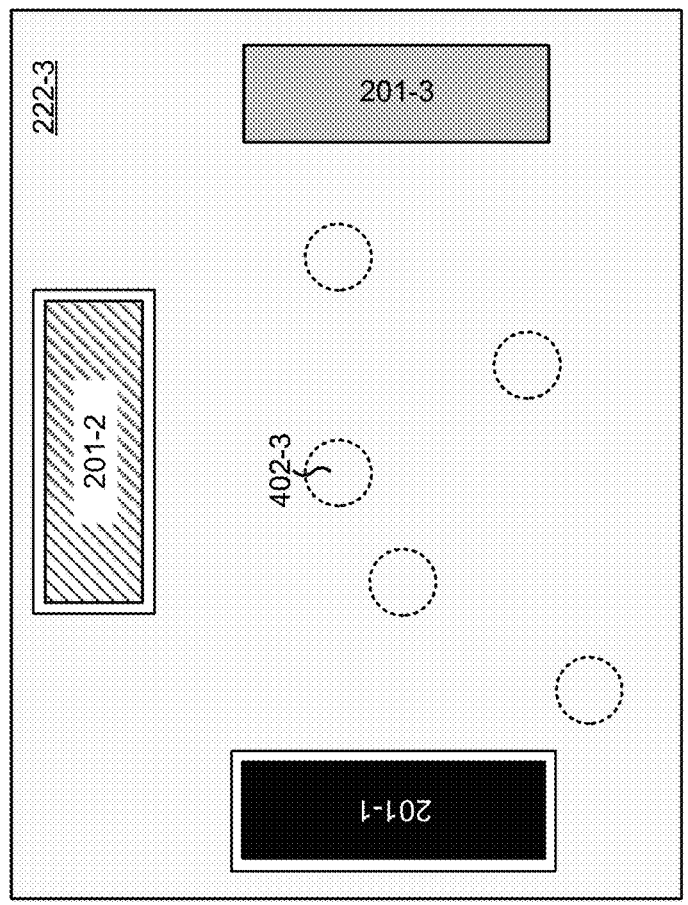

As shown in FIG. 4C, a metal layer 222-3 may be formed. As shown, metal layer 222-3 may be formed such that metal layer 222-2b connects (e.g., via a contact layer associated with each emitter 402-3, a respective metal layer portion 222-1a over each emitter, and a respective metal layer portion 222-2a over each emitter) each of a group of emitters 402-3 (e.g., identified with dotted circles in FIG. 4C) to anode 201-3. Here, an electrical path from anode 201-3 to a given emitter 402-3 passes through metal layer 222-3, a metal layer portion 222-2a over the given emitter, and a metal layer portion 222-1a over the given emitter 402-2. Anode 201-1 and anode 201-2 are electrically isolated from metal layer 222-3 (e.g., by further openings in metal layer 222-3).

As further shown, since emitters 402 are bottom-emitting, an emission area of each emitter 402 is covered by metal layer 222-3. In some implementations, an isolation layer (not shown) is deposited on metal layer 222-3 in order to isolate metal layer 222-3.

In this way, multiple metal layers 222 of an emitter array 400 (e.g., a VCSEL array) may enable arbitrarily arranged (separately addressable) groups of emitters 402 to be provided on a same die area without a need to increase a pitch between a given pair of emitters 402. Further, use of the multiple metal layers 222 may provide increased manufacturability and lower electrical resistance (thereby improving electrical-to-optical efficiency) as compared to a VCSEL array that uses a single metal layer.

Figure 4D:
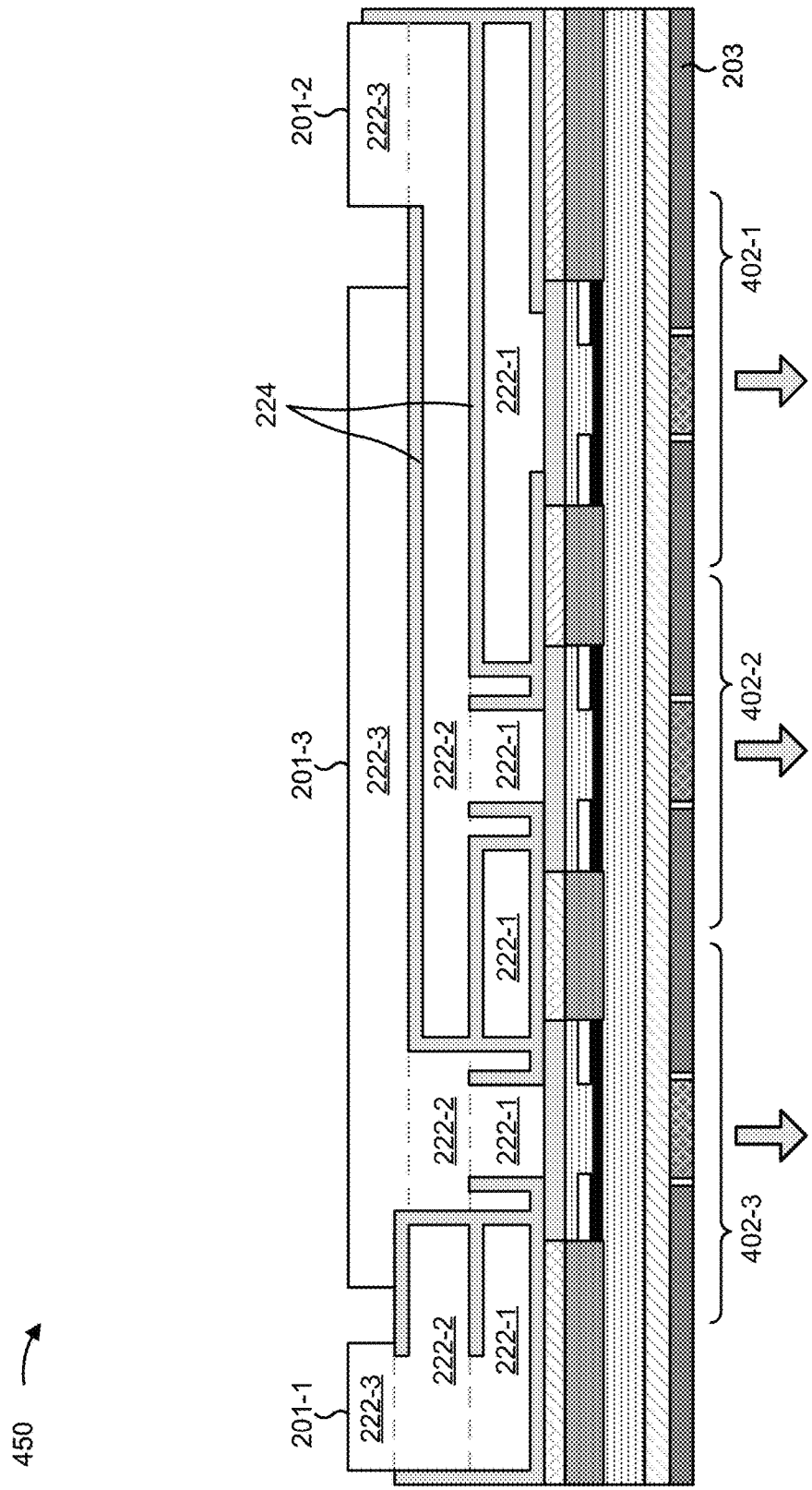

FIG. 4D is an example cross section of an example bottom-emitting emitter array 400. As shown in FIG. 4D, metal layers 222 and isolation layers 224 can be arranged such that emitter 402-2 is connected to anode 201-2 by portions of metal layers 222-1, 222-2, and 222-3 (e.g., through vias in isolation layer 224). Similarly, metal layers 222 and isolation layers 224 can be arranged such that emitter 402-3 is connected to anode 201-3 by portions of metal layers 222-1, 222-2, and 222-3 (e.g., through vias in isolation layer 224 metal layer 222). Further, while not illustrated in the cross-section of FIG. 4D, metal layers 222 and isolation layers 224 can be arranged such that emitter 402-1 is connected to anode 201-1 by portions of metal layers 222-1, 222-2, and 222-3 (e.g., through vias in isolation layer 224). In some implementations, as shown, a backside layer 203 of emitter array 400 may include an anti-reflective coating over emission areas of emitters 402 (e.g., identified by the hatched portions of the backside layer of emitter array 400), and elsewhere may include a metallic contact layer.

In some implementations, the use of multiple metal layers 222 on the epitaxial side of a bottom emitting emitter array 400 permits a metal thermal pad to be disposed over emitters 402 without shorting anodes 201.

Figure 4E:
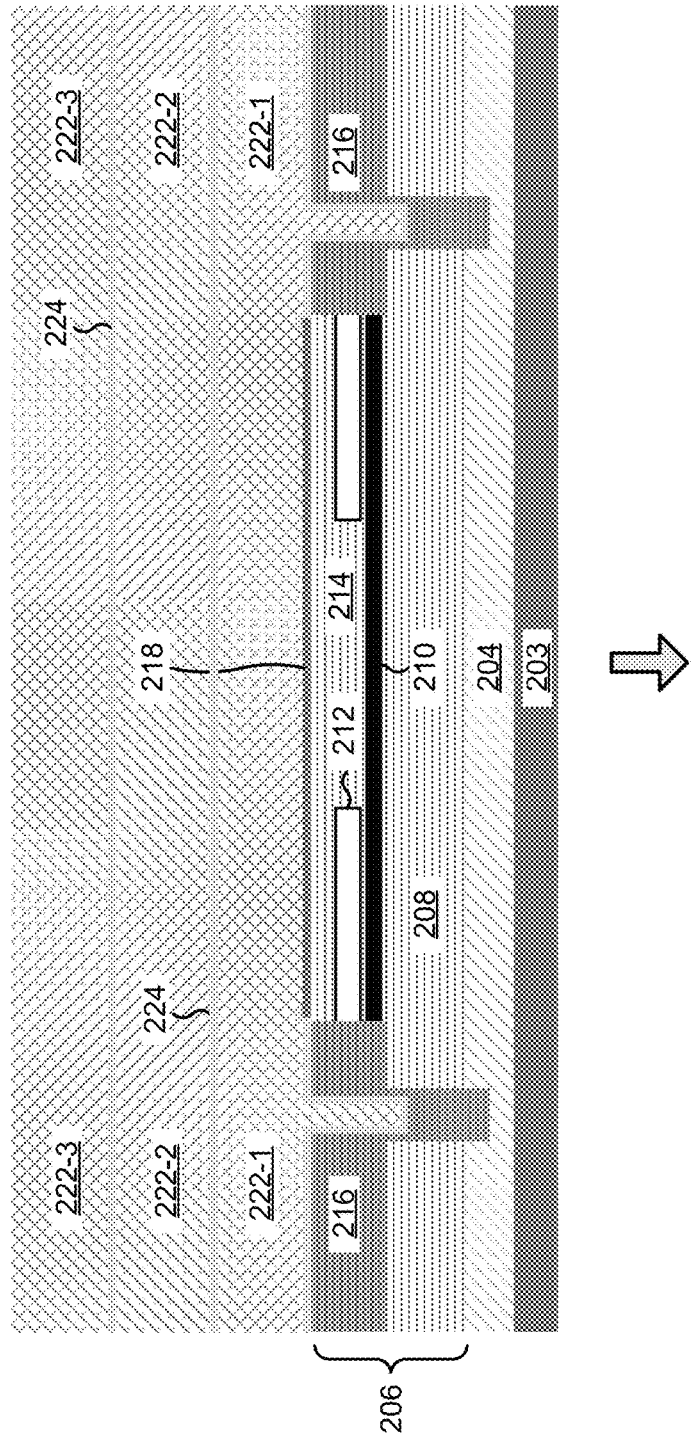
Figure 4F:
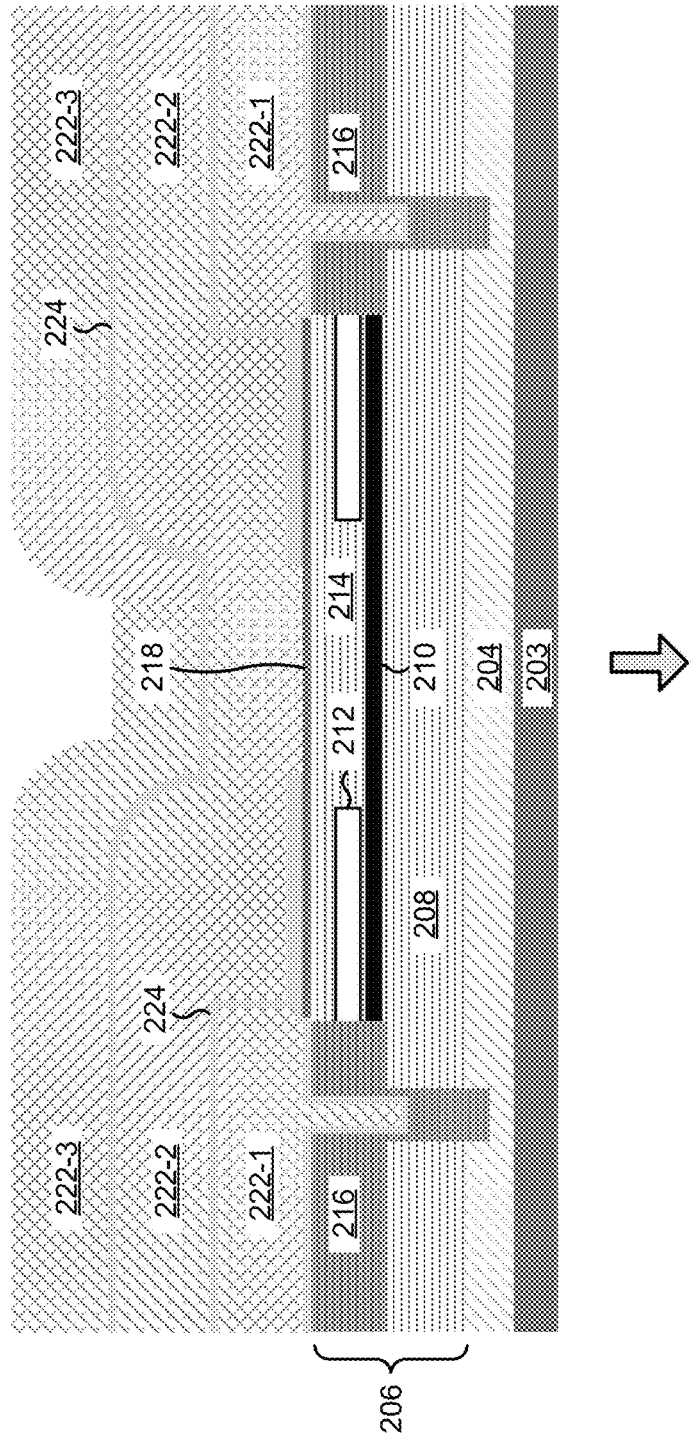
Figure 4G:
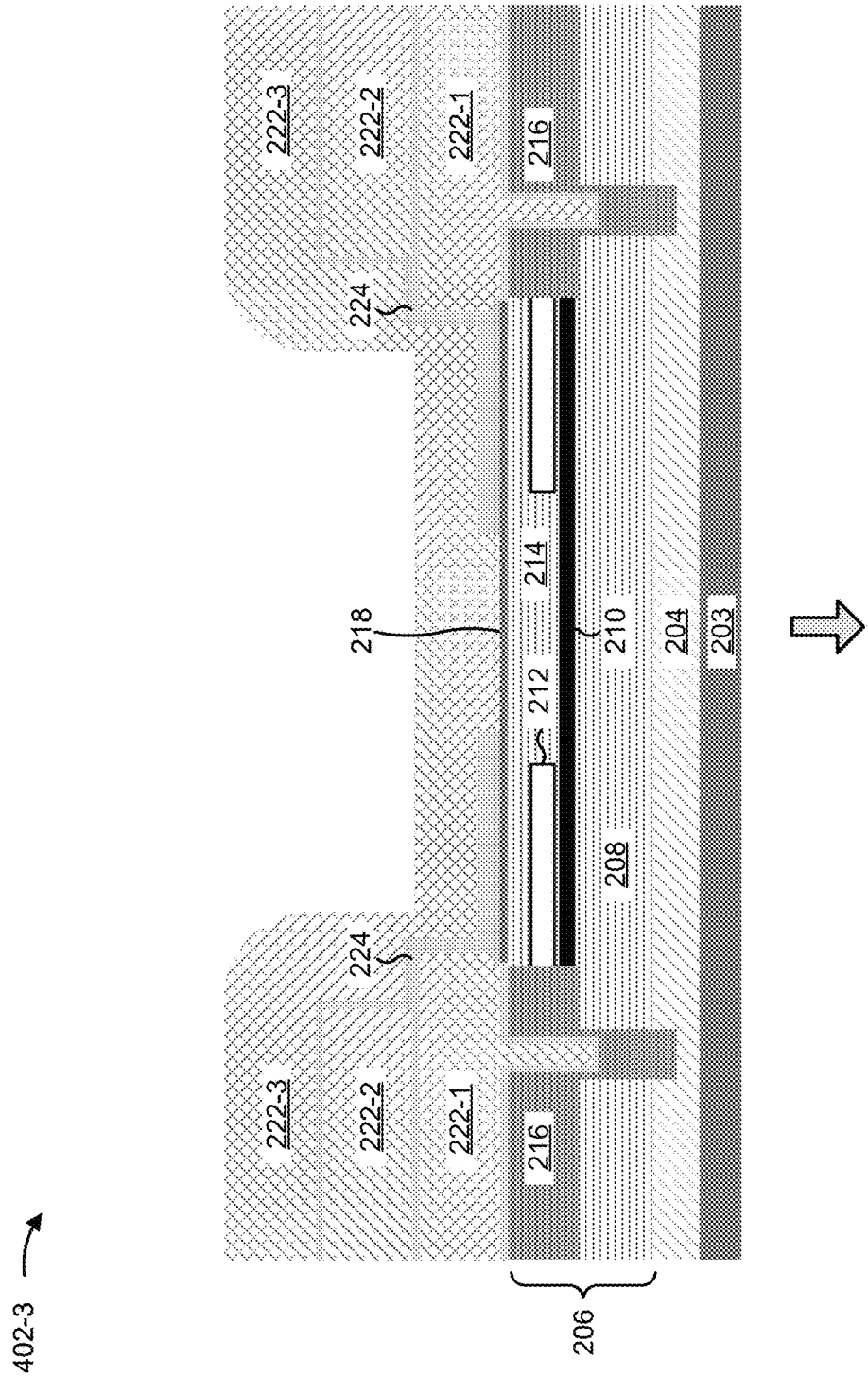

As described for top emitting VCSELs, portions of some of the metal layers may be deposited in a different grouping, but with the same resulting electrical configuration. Analogously, this approach is illustrated in FIGS. 4E-4G showing cross sections of bottom-emitting emitters 402. FIG. 4E is an example cross section of an emitter 402-1 that is contacted by metal layer 222-1. In this case, the cross-section is the same as for emitter 402-1 in FIG. 4D. FIG. 4F is an example cross section of an emitter 402-2 that is contacted by metal layer 222-2, and FIG. 4G is an example cross section of an emitter 402-3 that is contacted by metal layer 222-3.

As shown in FIG. 4E, contact layer 218 of emitter 402-1 is connected to metal layer 222-1, which can be connected to anode 201-1 (i.e., the anode 201 that is associated with a group of emitters 402-1). As shown in FIG. 4E, metal layer 222-1 and isolation layers 224 of emitter 402-1 may be formed such that metal layer 222-1 is isolated from metal layer 222-2 and metal layer 222-3, in some implementations.

As shown in FIG. 4F, contact layer 218 of emitter 402-2 is connected to metal layer 222-2, which can be connected to anode 201-2 (i.e., the anode 201 that is associated with a group of emitters 402-2). As shown in FIG. 4F, near emitter 402-2, metal layer 222-1 may be formed such that metal layer 222-1 is not present over contact layer 218 of emitter 402-2. As such, and as indicated in FIG. 4F, when metal layer 222-2 is formed, metal layer 222-2 contacts contact layer 218 of emitter 402-2. As further shown, isolation layers 224 of emitter 402-2 may be formed such that metal layer 222-2 is isolated from metal layer 222-1 and metal layer 222-3, in some implementations.

As shown in FIG. 4G, contact layer 218 of emitter 402-3 is connected to metal layer 222-3, which can be connected to anode 201-3 (i.e., the anode 201 that is associated with a group of emitters 402-3). As shown in FIG. 4G, near emitter 402-3, both metal layer 222-2 and metal layer 222-1 may be formed such that metal layer 222-2 and metal layer 222-1 are not present over contact layer 218 of emitter 402-3. As such, and as indicated in FIG. 4G, when metal layer 222-3 is formed, metal layer 222-3 contacts contact layer 218 of emitter 402-3. As further shown, isolation layers 224 of emitter 402-3 may be formed such that metal layer 222-3 is isolated from metal layer 222-1 and metal layer 222-3, in some implementations.

The number and arrangement of emitters and layers shown in FIGS. 4A-4G are provided as examples. In practice, emitter array 400 may include additional emitters 402, fewer emitters 402, different emitters 402, differently arranged emitters 402, and/or the like, than those shown in FIGS. 4A-4G. Similarly, emitter 402 may include additional layers, fewer layers, different layers, differently arranged layers, layers with different thicknesses or relative thicknesses, and/or the like, than those shown in FIGS. 4A-4G. For example, emitter 402 may include a different number (e.g., two, more than three) and/or arrangement of metal layers 222 than shown and described in association with in FIGS. 4A-4G. Further, while three metal layers 222 are shown for three anodes 201, it may also be possible to combine some connections on a single layer. In other words, a number of metal layers 222 may not be equal to (e.g., may be less than) a number of anodes 201, in some implementations. Additionally, a set of layers (e.g., one or more layers) of emitter 402 may perform one or more functions described as being performed by another set of layers of emitter 402.

Some implementations described herein provide an emitter array (e.g., an array of VCSELs, also referred to as VCSEL array) including multiple metal layers 222 that enable arbitrarily arranged groups of emitters to be provided from a same die area (e.g., for use in a 3D-sensing application). In some implementations, multiple metal layers 222 increase efficiency in use of the die area (e.g., by permitting multiple patterns to be displayed from the same die area), thereby lowering die cost, optics cost, and/or assembly cost (e.g., as compared to using separate die areas). Additionally, emitter array 200 with multiple metal layers 222 may have increased manufacturability and lower electrical resistance (thereby improving electrical-to-optical efficiency) as compared to a VCSEL array that uses a single metal layer. Further, since the configuration of metal layers can define the groups of emitters, the epitaxial growth of the array of emitters may not need to be changed when changing the configuration of the groups of emitters. In other words, a template VCSEL array may be grown which can later be configured (by defining the metal layers) for different groups of emitters or patterns of structured light.

In some implementations, a VCSEL array may include a first VCSEL to emit light on a non-epitaxial side of a substrate. A contact of the first VCSEL may be on an epitaxial side of the substrate and may be electrically connected to a first metal layer. The first metal layer may be on the epitaxial side of the substrate and may be formed substantially over the VCSEL array. The VCSEL array may include a second VCSEL to emit light on the non-epitaxial side of the substrate. A contact of the second VCSEL may be on the epitaxial side of the substrate and may be electrically connected to a second metal layer. The second metal layer may be on the epitaxial side of the substrate and may be formed substantially over the first metal layer.

In some implementations, a VCSEL array may include a first VCSEL to emit light on an epitaxial side of a substrate. A contact of the first VCSEL may be on the epitaxial side of the substrate and is electrically connected to a first metal layer. The first metal layer may be on the epitaxial side of the substrate and may be formed substantially over the VCSEL array. The first metal layer may include emission openings for the VCSELs of the VCSEL array. The VCSEL array may include a second VCSEL to emit light on the epitaxial side of the substrate. A contact of the second VCSEL may be on the epitaxial side of the substrate and may be electrically connected to a second metal layer. The second metal layer may be on the epitaxial side of the substrate and may be formed substantially over the first metal layer. The second metal layer may include emission openings for the VCSELs of the VCSEL array.

In some implementations, a VCSEL array may include a first VCSEL to emit light on an emitting side of a substrate. The emitting side of the substrate may be an epitaxial side of the substrate (e.g., a top or front side of the substrate when, for example, VCSELs of the VCSEL array are top-emitting VCSELs), or may be a non-epitaxial side of the substrate (e.g., a back side of the substrate when, for example, the VCSELs of the VCSEL array are bottom-emitting VCSELs). A contact of the first VCSEL may be on the epitaxial side of the substrate and may be electrically connected to a first metal layer. The first metal layer may be on the epitaxial side of the substrate and may be formed substantially over the VCSEL array. The VCSEL array may include a second VCSEL to emit light on the emitting side of the substrate. A contact of the second VCSEL may be on the epitaxial side of the substrate and may be electrically connected to a second metal layer. The second metal layer may be on the epitaxial side of the substrate and may be formed substantially over the first metal layer. In some implementations, when the emitting side of the substrate is the epitaxial side of the substrate, the first metal layer and the second metal layer may include emission openings for the first VCSEL and the second VCSEL.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical device comprising:
   an array of vertical-cavity surface-emitting lasers (VCSELs),
      each VCSEL having an emission area;
   a first metal layer that substantially covers the array,
      the first metal layer including openings for each emission area, and
      the first metal layer being connected to a first group of emitters of the array;
   a second metal layer that substantially covers the first metal layer,
      the second metal layer being connected to a second group of emitters of the array,
         wherein the second group does not include emitters of the first group; and
   an electrical isolation layer between the first metal layer and the second metal layer,
      the electrical isolation layer including vias for electrically connecting portions of the first metal layer and portions of the second metal layer.

2. The optical device of claim 1, wherein the first metal layer connects the first group to a first anode and the second metal layer connects the second group to a second anode.

3. The optical device of claim 1, further comprising:
   a third metal layer that substantially covers the second metal layer,
      the third metal layer being connected to a third group of emitters of the array,
         wherein the third group does not include the emitters of the first group or emitters of the second group.

4. The optical device of claim 3, wherein the third metal layer connects the third group to a third anode.

5. The optical device of claim 3, wherein the electrical isolation layer is a first electrical isolation layer and the vias are first vias; and
   wherein the optical device further comprises:
      a second electrical isolation layer between the second metal layer and the third metal layer,
         the second electrical isolation layer including second vias for electrically connecting portions of the second metal layer and portions of the third metal layer.

6. The optical device of claim 5, wherein the second electrical isolation layer is not formed on the third group.

7. The optical device of claim 5, wherein the first group is connected to an anode through the first vias and the second vias.

8. The optical device of claim 5, wherein the second group is connected to an anode through the first vias and the second vias.

9. The optical device of claim 5, wherein the third group is connected to an anode through the first vias and the second vias.

10. The optical device of claim 1, further comprising:
    a backside layer of the array comprising an anti-reflective coating over each emission area.

11. An emitter array, comprising:
    a set of emitters,
       wherein each of the set of emitters has a respective emission area;
    a first metal layer,
       wherein the first metal layer substantially covers the emitter array,
       wherein the first metal layer includes openings for each emission area, and
       wherein the first metal layer is connected to first emitters of the set of emitters;
    a second metal layer,
       wherein the second metal layer substantially covers the first metal layer, and
       wherein the second metal layer is connected to second emitters of the set of emitters,
          wherein the second emitters do not include the first emitters; and
    an electrical isolation layer,
       wherein the electrical isolation layer is between the first metal layer and the second metal layer, and
       wherein the electrical isolation layer includes vias for electrically connecting a portion of the first metal layer and portion of the second metal layer.

12. The emitter array of claim 11, wherein the first metal layer connects the first emitters to a first anode and the second metal layer connects the second emitters to a second anode.

13. The emitter array of claim 11, wherein the first metal layer is not present over contact layers of the second emitters.

14. The emitter array of claim 13, wherein the second metal layer contacts the contact layers of the second emitters.

15. The emitter array of claim 11, further comprising:
    a third metal layer that substantially covers the second metal layer,
       the third metal layer being connected to third emitters of the set of emitters,
          wherein the third emitters do not include the first emitters or the second emitters.

16. The emitter array of claim 15, wherein the first metal layer and the second metal layer are not present over contact layers of the third emitters.

17. The emitter array of claim 16, wherein the third metal layer contacts the contact layers of the third emitters.

18. A vertical-cavity surface-emitting laser (VCSEL), comprising:
    a first metal layer that includes an opening for an emission area of the VCSEL,
       the first metal layer being connected to first emitters;
    a second metal layer that substantially covers the first metal layer,
       the second metal layer being connected to second emitters,
          wherein the second emitters do not include the first emitters; and
    an electrical isolation layer between the first metal layer and the second metal layer,
       the electrical isolation layer either:
          including a via for electrically connecting a portion of the first metal layer and a portion of the second metal layer, or
          isolating the portion of the first metal layer from the portion of the second metal layer.

19. The VCSEL of claim 18, further comprising:
    a third metal layer that substantially covers the second metal layer,
       the third metal layer being connected to third emitters,
          wherein the third emitters do not include the first emitters or the second emitters.

20. The VCSEL of claim 19, wherein the electrical isolation layer is a first electrical isolation layer and the via is a first via and
wherein the VCSEL further comprises:
a second electrical isolation layer between the second metal layer and the third metal layer,
the second electrical isolation layer including a second via for electrically connecting a portion of the second metal layer and a portion of the third metal layer.

* * * * *